(12) United States Patent
Lin et al.

(10) Patent No.: US 12,284,810 B2
(45) Date of Patent: Apr. 22, 2025

(54) MEMORY DEVICE AND MANUFACTURING METHOD THEREOF

(71) Applicant: Taiwan Semiconductor Manufacturing Company, Ltd., Hsinchu (TW)

(72) Inventors: Meng-Han Lin, Hsinchu (TW); Han-Jong Chia, Hsinchu (TW); Feng-Cheng Yang, Hsinchu County (TW); Bo-Feng Young, Taipei (TW); Nuo Xu, San Jose, CA (US); Sai-Hooi Yeong, Hsinchu County (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 9 days.

(21) Appl. No.: 18/354,667

(22) Filed: Jul. 19, 2023

(65) Prior Publication Data

US 2023/0363172 A1 Nov. 9, 2023

Related U.S. Application Data

(62) Division of application No. 17/327,752, filed on May 23, 2021, now Pat. No. 11,910,615.

(60) Provisional application No. 63/137,754, filed on Jan. 15, 2021.

(51) Int. Cl.
*H10B 51/20* (2023.01)
*H10B 51/10* (2023.01)

(52) U.S. Cl.
CPC .............. *H10B 51/20* (2023.02); *H10B 51/10* (2023.02)

(58) Field of Classification Search
CPC ........ H10B 51/10; H10B 51/20; H10B 51/30; H10B 53/00; H10B 53/20; H10B 53/30
See application file for complete search history.

(56) References Cited

U.S. PATENT DOCUMENTS

| 11,527,553 | B2 * | 12/2022 | Lin | H01L 29/41775 |
| 11,581,337 | B2 * | 2/2023 | Wang | H01L 29/41741 |
| 2021/0375938 | A1 * | 12/2021 | Lin | H10B 51/30 |
| 2022/0344370 | A1 * | 10/2022 | Lin | H10B 51/20 |

* cited by examiner

*Primary Examiner* — Allison Bernstein
(74) *Attorney, Agent, or Firm* — JCIPRNET

(57) ABSTRACT

A memory device including a word line, a source line, a bit line, a memory layer, a channel material layer is described. The word line extends in a first direction, and liner layers disposed on a sidewall of the word line. The memory layer is disposed on the sidewall of the word line between the liner layers and extends along sidewalls of the liner layers in the first direction. The liner layers are spaced apart by the memory layer, and the liner layers are sandwiched between the memory layer and the word line. The channel material layer is disposed on a sidewall of the memory layer. A dielectric layer is disposed on a sidewall of the channel material layer. The source line and the bit line are disposed at opposite sides of the dielectric layer and disposed on the sidewall of the channel material layer. The source line and the bit line extend in a second direction perpendicular to the first direction. A material of the liner layers has a dielectric constant lower than that of a material of the memory layer.

20 Claims, 34 Drawing Sheets

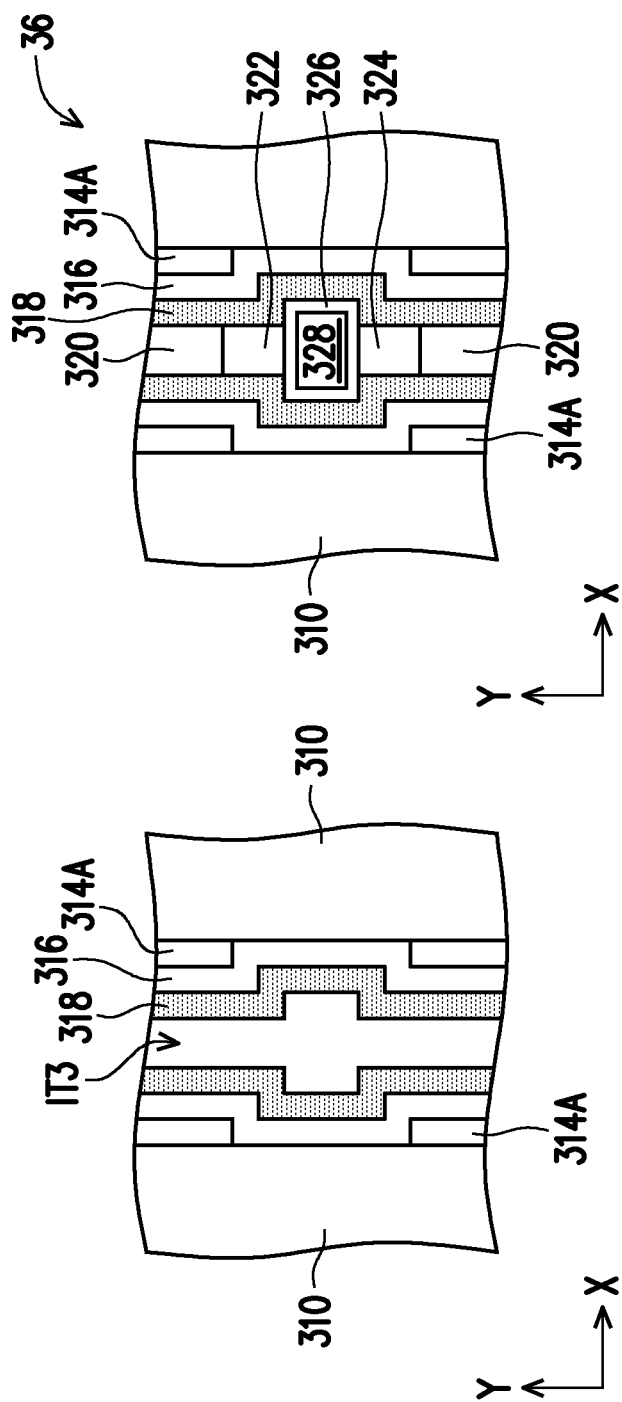

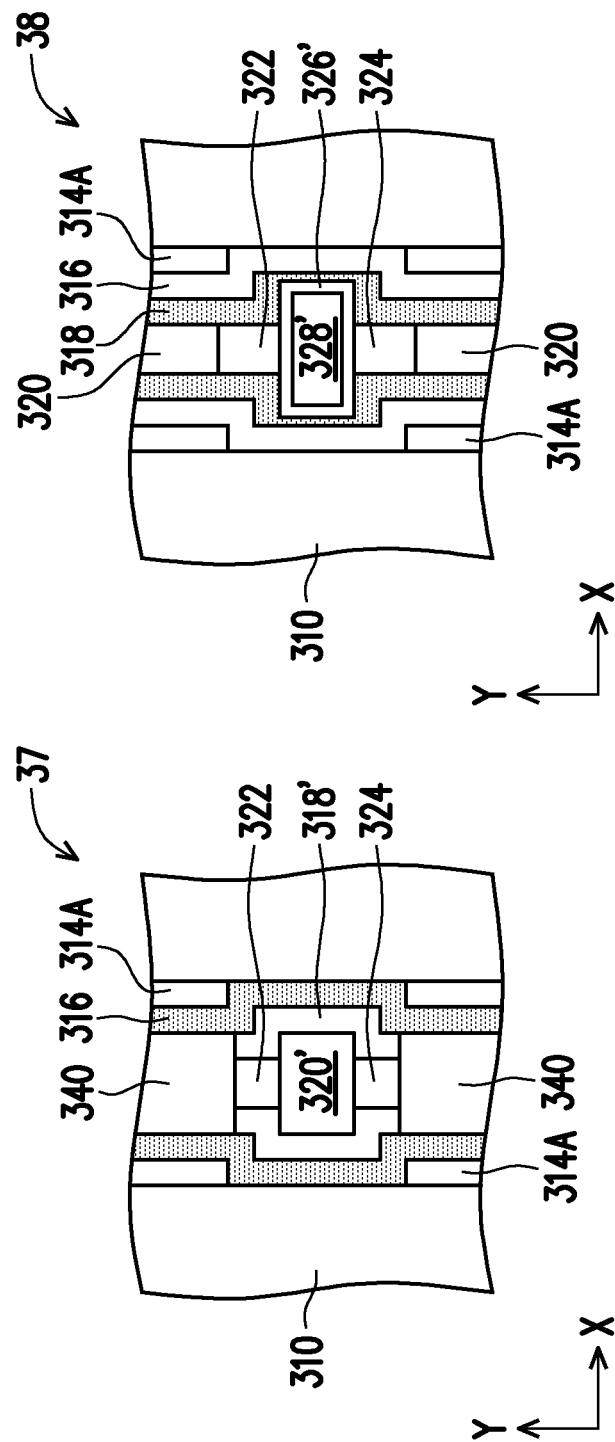

MEMORY DEVICE AND MANUFACTURING METHOD THEREOF

CROSS-REFERENCE TO RELATED APPLICATION

This application is a divisional application and claims the priority benefit of U.S. patent application Ser. No. 17/327,752, filed on May 23, 2021, now allowed. The prior application Ser. No. 17/327,752 claims the priority benefit of U.S. provisional application Ser. No. 63/137,754, filed on Jan. 15, 2021. The entirety of each of the above-mentioned patent applications is hereby incorporated by reference herein and made a part of this specification.

BACKGROUND

As the size of the integrated circuit keeps decreasing, the integration density of the component or device gradually increases. Semiconductor memory devices include volatile memories and non-volatile memories. For semiconductor memory devices, the increased memory cell density leads to compact structure designs with reduced sizes but maintaining the performance of the semiconductor memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 33 to FIG. 36 are schematic top views of structures produced at various stages of a manufacturing method of a memory device according to some embodiments of the present disclosure.

FIG. 37 and FIG. 38 are schematic cross-sectional views showing a portion of the exemplary structure(s) of a memory device according to embodiments of the present disclosure.

DETAILED DESCRIPTION

Figure 1:
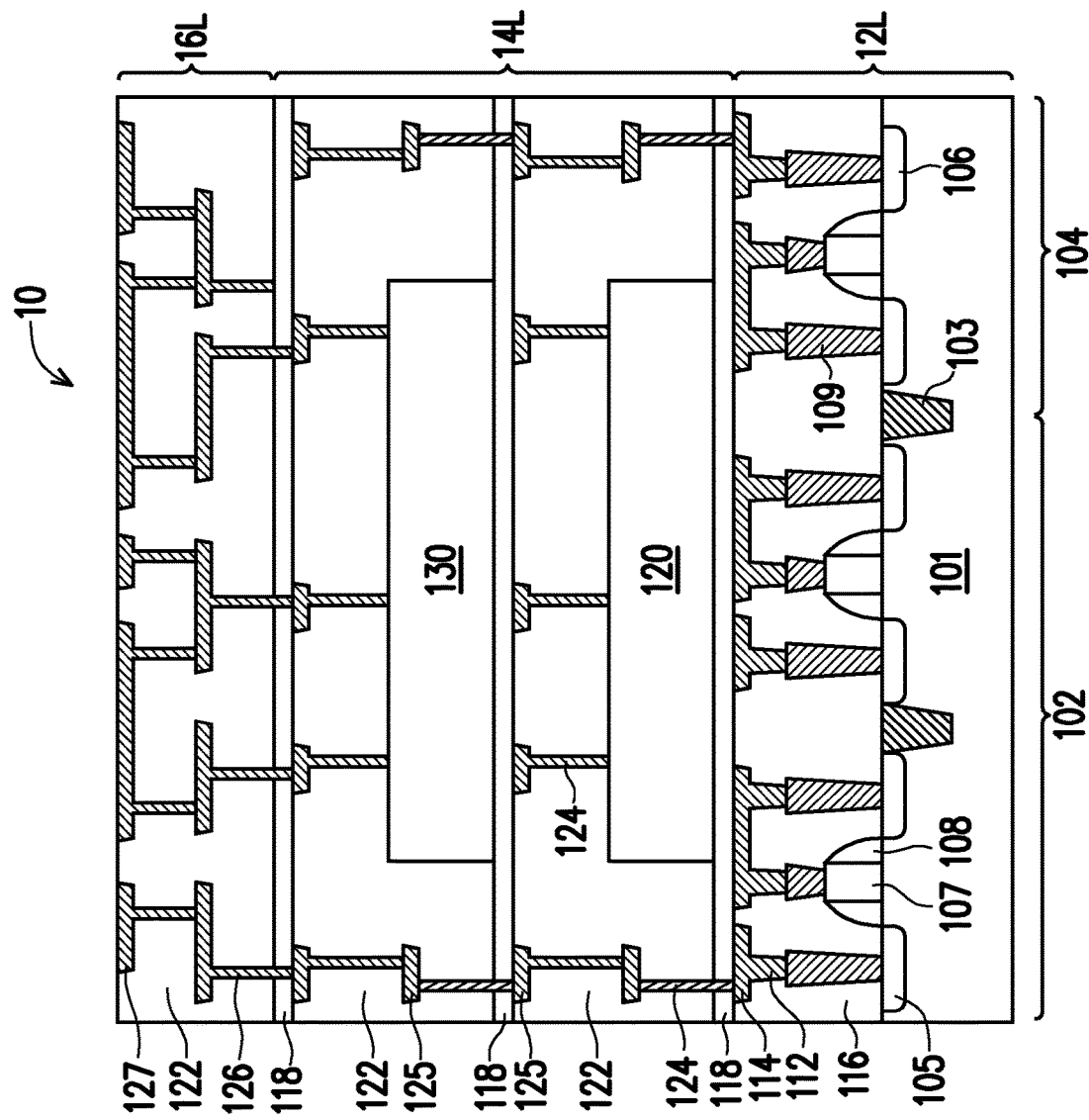
FIG. 1 illustrates a cross-sectional view of a semiconductor device with integrated memory devices according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a semiconductor device 10 according to some embodiments of the present disclosure. In some embodiments, the semiconductor device 10 is formed with integrated memory devices 120 and 130. In some embodiments, the semiconductor device 10 includes field effect transistor (FET) devices 110 formed through the front-end-of-line (FEOL) manufacturing processes and three-dimensional (3D) memory devices formed through the back-end-of-line (BEOL) manufacturing processes. In one embodiment, the FET devices 110 include fin field effect transistors (FinFETs), and the at least one of the memory devices 120, 130 includes three-dimensional (3D) ferroelectric random access memory (FeRAM) devices. It is understood that FinFETs are used as examples, and other kinds of FEOL devices such as planar transistors or gate-all-around (GAA) transistors may be used herein and included within the scope of the present disclosure. That is, the 3D memory devices 120, 130 may be integrated with or in any suitable semiconductor devices. In FIG. 1, the details of the memory devices 120, 130 are not shown and further details will be described later in subsequent figures.

As illustrated in FIG. 1, the semiconductor device 10 includes different regions for forming different types of circuits. For example, the semiconductor device 10 may include a first region 102 for forming logic circuits, and a second region 104 for forming, e.g., peripheral circuits, input/output (I/O) circuits, electrostatic discharge (ESD) circuits, and/or analog circuits. Other regions for forming other types of circuits are possible and are fully intended to be included within the scope of the present disclosure. The semiconductor device 10 includes a substrate 101. In some embodiments, the substrate 101 may be a bulk substrate, such as a silicon substrate, doped or undoped, or an active layer of a semiconductor-on-insulator (SOI) substrate. In some embodiments, the substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. For example, additional electrical components, such as resistors, capacitors, inductors, diodes, or the like, may be formed in or on the substrate 101 during the FEOL manufacturing processes.

As seen in FIG. 1, the FET devices 110 are formed on the substrate 101, and isolation regions 103, such as shallow trench isolation (STI) regions, are formed between or around the FET devices 110. In some embodiments, the FET device 110 includes a gate electrode 107 are formed over the substrate 101 with gate spacers 108 formed along sidewalls of the gate electrode 107, and source/drain regions 105/106, such as doped or epitaxial source/drain regions, are formed on opposing sides of the gate electrode 107. In some embodiments, conductive contacts 109, such as gate contacts and source/drain contacts, are formed over and electrically coupled to respective underlying electrically conductive features (e.g., gate electrodes 107 or source/drain regions 105/106). In some embodiments, a dielectric layer 116, such as an inter-layer dielectric (ILD) layer, is formed over the substrate 101 and covering the source/drain regions 105/106, the gate electrode 107 and the contacts 109, and other electrically conductive features, such as metallic interconnect structures comprising conductive vias 112 and conductive lines 114, are embedded in the dielectric layer 116. It is understood that the dielectric layer 116 may include more than one dielectric layers of the same or different dielectric materials. Collectively, the substrate 101, the FET devices 110, the contacts 109, conductive features 112/114, and the dielectric layers 116 shown in FIG. 1 may be referred to as the front-end level 12L.

Referring to FIG. 1, dielectric layers 118 and dielectric layers 122 are formed over the dielectric layer 116 in alternation. In one embodiment, at least one of the dielectric layers 118 may include an etch stop layer (ESL). In some embodiments, the materials of the dielectric layers 118 may be different from the materials of the dielectric layers 116 and 122. In some embodiments, the material of the dielectric layer(s) 118 includes silicon nitride or carbide formed by plasma-enhanced physical vapor deposition (PECVD). In some embodiments, one or more of the dielectric layers 118 may be omitted. In some embodiments, the dielectric layers 116 and 122 may be formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In FIG. 1, memory devices 120 and 130, each of which may include a plurality of memory cells, are formed in the dielectric layer 122 and coupled to electrically conductive features (e.g., metallic vias 124 and metallic lines 125) in the dielectric layer 122.

In FIG. 1, the memory devices 120 and 130 are formed at different layers of the dielectric layers 122, and the memory device 120 is formed at the lower layer and the memory device 130 is formed at the upper layer. In some embodiments, the memory devices 120 and 130 have the same or similar structure. In some embodiments, the memory devices 120 and 130 have different structure designs. Although two layers of memory devices are depicted in FIG. 1, other numbers of layers of memory devices, such as one layer, three layers, or more, are also possible and are encompassed within the scope of the present disclosure. Collectively, the layers of memory device 120 and 130 are referred to as the memory device level 14L or a memory region of the semiconductor device 10. The memory device level 14L may be formed in the BEOL processes of semiconductor manufacturing. The memory devices 120 and 130 may be formed in the BEOL processes at any suitable locations within the semiconductor device 10, such as over the first region 102, over the second region 104, or over a plurality of regions.

Still referring to FIG. 1, after the memory device level 14L is formed, an interconnect level 16L including electrically conductive interconnecting features (e.g., metallic vias 126 and metallic patterns 126) embedded in the dielectric layer(s) 122 is formed over the memory device level 14L. Suitable methods may be employed to form the interconnect level 16L and the details are not described herein. In some embodiments, the interconnect level 16L may electrically connect the electrical components formed in/on the substrate 101 to form functional circuits. In some embodiments, the interconnect level 16L may also electrically couple the memory devices 120, 130 to the FET devices 110 and/or the components in/on the substrate 101. In addition, the memory devices 120 and 130 may be electrically coupled to an external circuit or an external device through the structure of the interconnect level 16L. In some embodiments, the memory devices 120 and 130 are electrically coupled to the FET devices 110 of the front-end level 12L and/or other electrical components formed in the substrate 101, and are controlled or accessed (e.g., written to or read from) by functional circuits of the semiconductor device 10. Alternatively, the memory devices 120, 130 are electrically coupled to (e.g., controlled or accessed) an external circuit of another semiconductor device through the structure of the interconnect level 16L.

Figure 29:
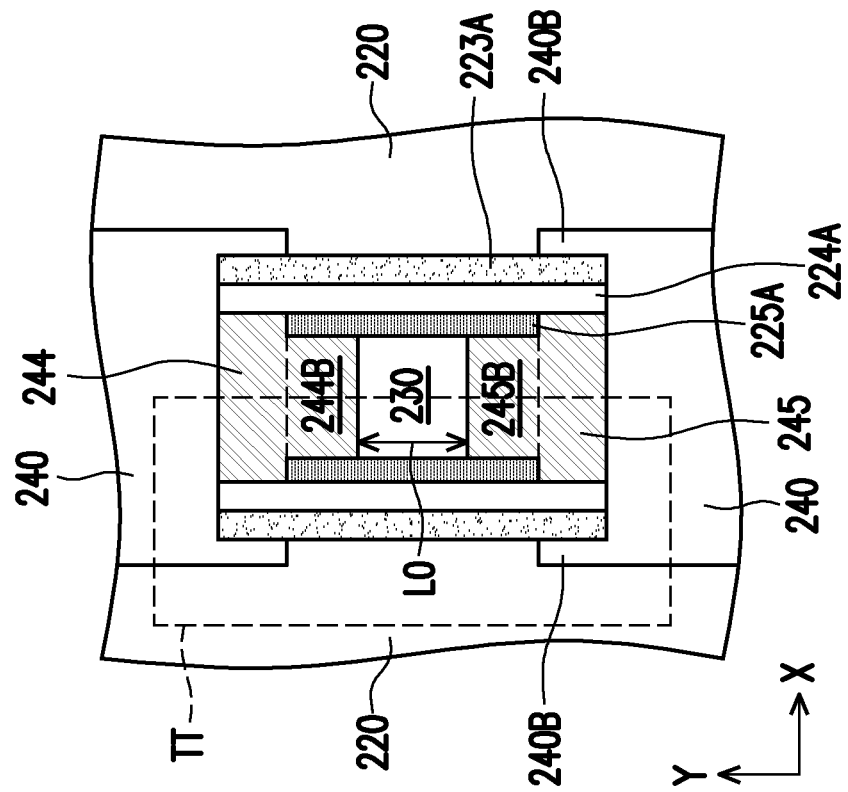

FIG. 2 to FIG. 30 are various views of structures produced at various stages of a manufacturing method of a memory device according to some embodiments of the present disclosure. FIGS. 2-18, 20-22 and 24-26 show schematic three-dimensional views of the structures produced at various stages, and FIGS. 19, 23, 27 and 30 show schematic cross-sectional views of structures produced at various stages of a manufacturing method of a memory device according to some embodiments of the present disclosure. FIGS. 28 and 29 show the schematic top views of portions of the structures produced at various stages of a manufacturing method of a memory device according to some embodiments of the present disclosure. According to some embodiments, the memory device may be a three-dimensional (3D) memory device with a ferroelectric material. The memory devices depicted in the following paragraphs may be used as the memory devices 120 and 130 in FIG. 1.

Figure 2:
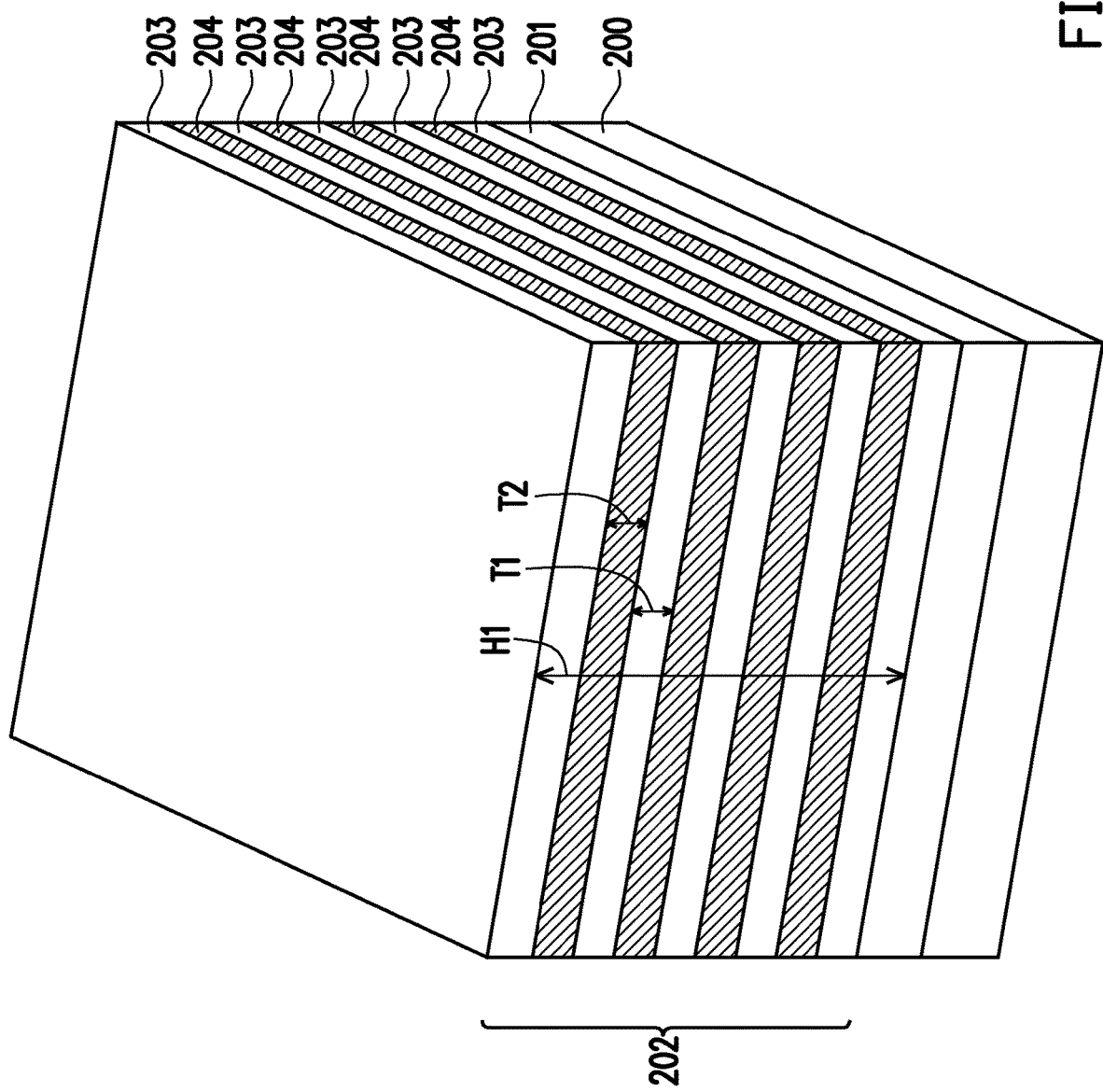
FIG. 2 to FIG. 30 are various views of structures produced at various stages of a manufacturing method of a memory device according to some embodiments of the present disclosure.

In FIG. 2, a dielectric structure 201 and a stack 202 are sequentially formed. As shown in FIG. 2, the dielectric structure 201 and the stack 202 are sequentially formed over a substrate 200, and the substrate 200 may be part of the front-end level 12L as described in the previous embodiments. It is understood that the substrate 200 and the dielectric structure 201 are not considered part of the 3D memory device. Although the substrate 200 is shown in FIG. 2, such feature will be omitted in the following figures, and some but not necessarily all features of the 3D memory device will be illustrated in the following figures.

In some embodiments, the stack 202 is a stack of multiple alternating dielectric layers and may also be referred to as a multilayered stack formed over the dielectric structure 201. In some embodiments, the material of the dielectric structure 201 may be different from the materials of the multilayered stack 202, and the dielectric structure 201 functions as an etch stop layer to provide etching selectivity for subsequent etching processes. In some embodiments, the material of the dielectric structure 201 comprises silicon carbide (SiC), silicon carbonitride, metal oxides such as aluminum oxide, or titanium oxide, metal nitrides such as aluminum nitride, titanium nitride, or the combination thereof. The dielectric structure 201 may be formed by a suitable formation method such as atomic layer deposition (ALD), CVD, PVD, or the like. In some embodiments, the multilayered stack 202 includes alternating first dielectric layers 203 and second dielectric layers 204. In some embodiments, the dielectric materials for forming the first dielectric layers 203 and the second dielectric layers 204 include silicon oxide, silicon nitride, silicon oxynitride, silicon carbide, silicon oxycarbide, silicon carbonitride, or the combination thereof. In some embodiments, the first dielectric layers 203 and the second dielectric layers 204 are formed by any compatible formation method, such as CVD, PVD, ALD, or the like. In FIG. 2, the multilayered stack 202 includes five layers of the first dielectric layers 203 and four layers of the second dielectric layers 204. It is comprehended that the number of the first dielectric layers 203 and the number of the second dielectric layers 204 may be any suitable number and may be adjusted based on product design.

In some embodiments, the materials of the first dielectric layers 203 are different from the materials of the second dielectric layers 204. As the multilayered stack 202 will be patterned and etched in subsequent processes, the dielectric materials of the first dielectric layers 203 and the dielectric materials of the second dielectric layers 204 are chosen to have high or acceptable etching selectivity between each other or one another. In some embodiments, the second dielectric layers 204 are sacrificial layers (or dummy layers), which will be etched off in later processes and replaced with word lines for the memory cells, while the patterned first dielectric layers 203 are used as isolation layers for isolating later formed memory cells. In one embodiment, the dielectric structure 201 is formed of titanium nitride, the first dielectric layers 203 may be formed of silicon oxide, and the second dielectric layers 204 may be formed of silicon nitride. Other combinations of dielectric materials having acceptable etching selectivity from one another may also be used.

In some embodiments, the first dielectric layers 203 may be formed to have a first thickness T1 and the second dielectric layers 204 may be formed to have a second thickness T2. In some embodiments, the thickness T1 of the first dielectric layers 203 are different from the thickness T2 of the second dielectric layers 204. In some embodiments, the thickness T1 of the first dielectric layers 203 are substantially the same as the thickness T2 of the second dielectric layers 204. In some embodiments, the stack 202 has an overall height H1 in the range of about 500 nm to about 10,000 nm. In some embodiments, the thickness T1 ranges from about 5 nm to about 100 nm. In some embodiments, the thickness T2 ranges from about 5 nm to about 100 nm.

Figure 3:
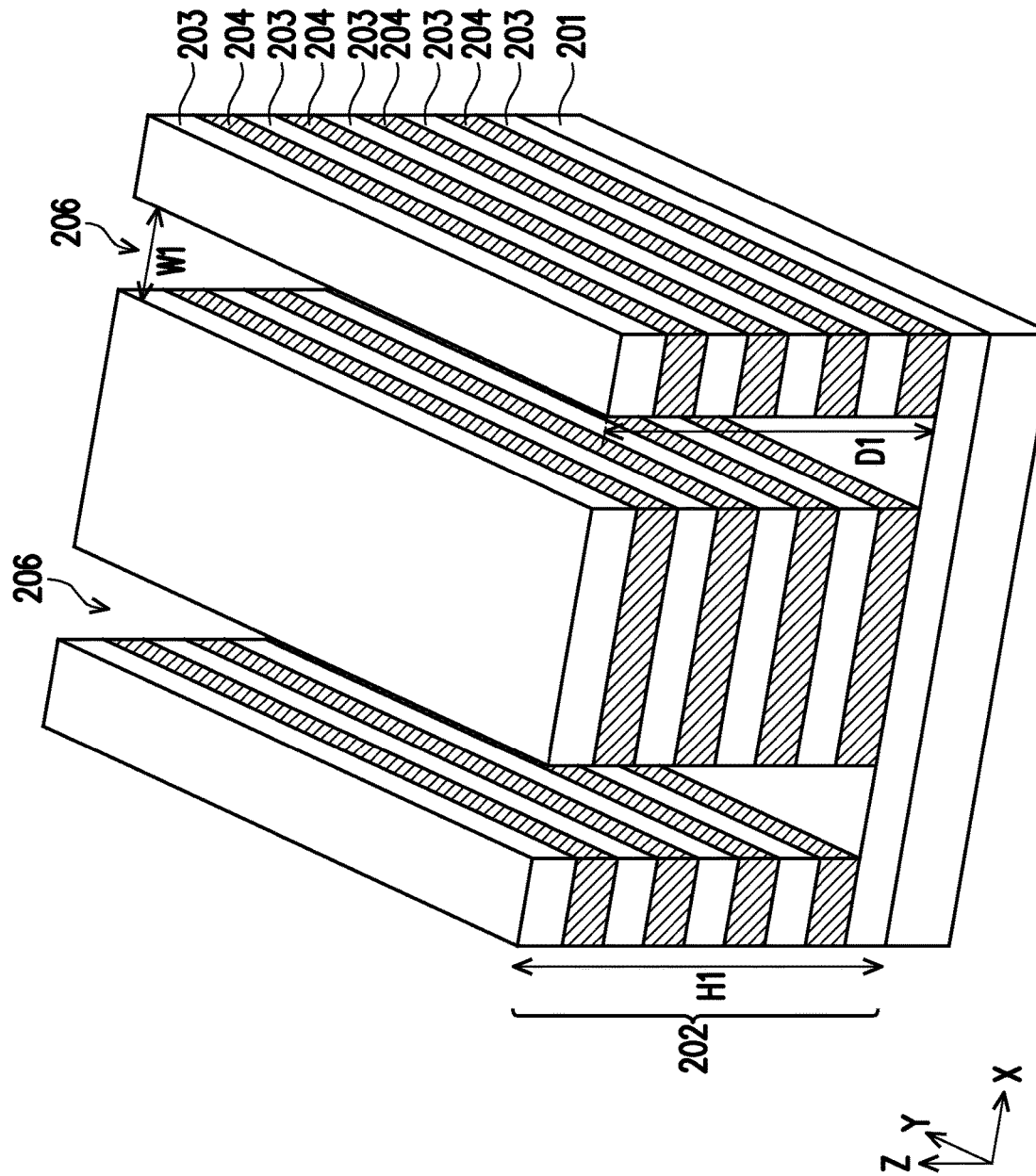

Referring to FIG. 3, a trench forming process is performed and first trenches 206 are formed in the multilayered stack 202. In some embodiments, the trenches 206 are trenches extending in parallel along the extending direction (Y direction). As seen in FIG. 3, the first trenches 206 are formed with a width W1 (along X-direction) and a depth D1 (along the vertical Z-direction) that is smaller than the height H1 (along the vertical Z-direction). That is, the first trenches 206 penetrate through four first dielectric layers 203 and four second dielectric layers 204 (counted from the top) and expose the bottommost first dielectric layer 203. In other embodiments, the first trenches 206 may penetrate through the whole multilayered stack 202 and expose the dielectric structure 201. The formation of the first trenches 206 involves using photolithographic and etching techniques, such as using a time-controlled etching process so as to stop at the bottommost first dielectric layer 203. For example, the etch process includes a dry etching process such as reactive ion etch (RIE) process. In some embodiments, the first dielectric layers 203 are formed of silicon oxide, and the second dielectric layers 204 are formed of silicon nitride, and the first trenches 206 may be formed using an anisotropic etching process such as a dry etching process with fluorine-based reactants. In one embodiment, the etch process includes a RIE process using reactants including $CF_4$, $CHF_3$, $CCl_4$, $CHCl_3$, $F_2$, $Cl_2$, $H_2$, $C_4F_8$, Ar, He or mixtures thereof. Although sidewalls of the first trenches 206 are shown as straight vertical sidewalls, the sidewalls may have sloped profiles, or concave or convex surfaces. The aspect ratio of the first trenches 206 and the separation distance of the first trenches 206 are finely selected to allow the subsequently formed memory array having acceptable memory cell density.

Figure 4:
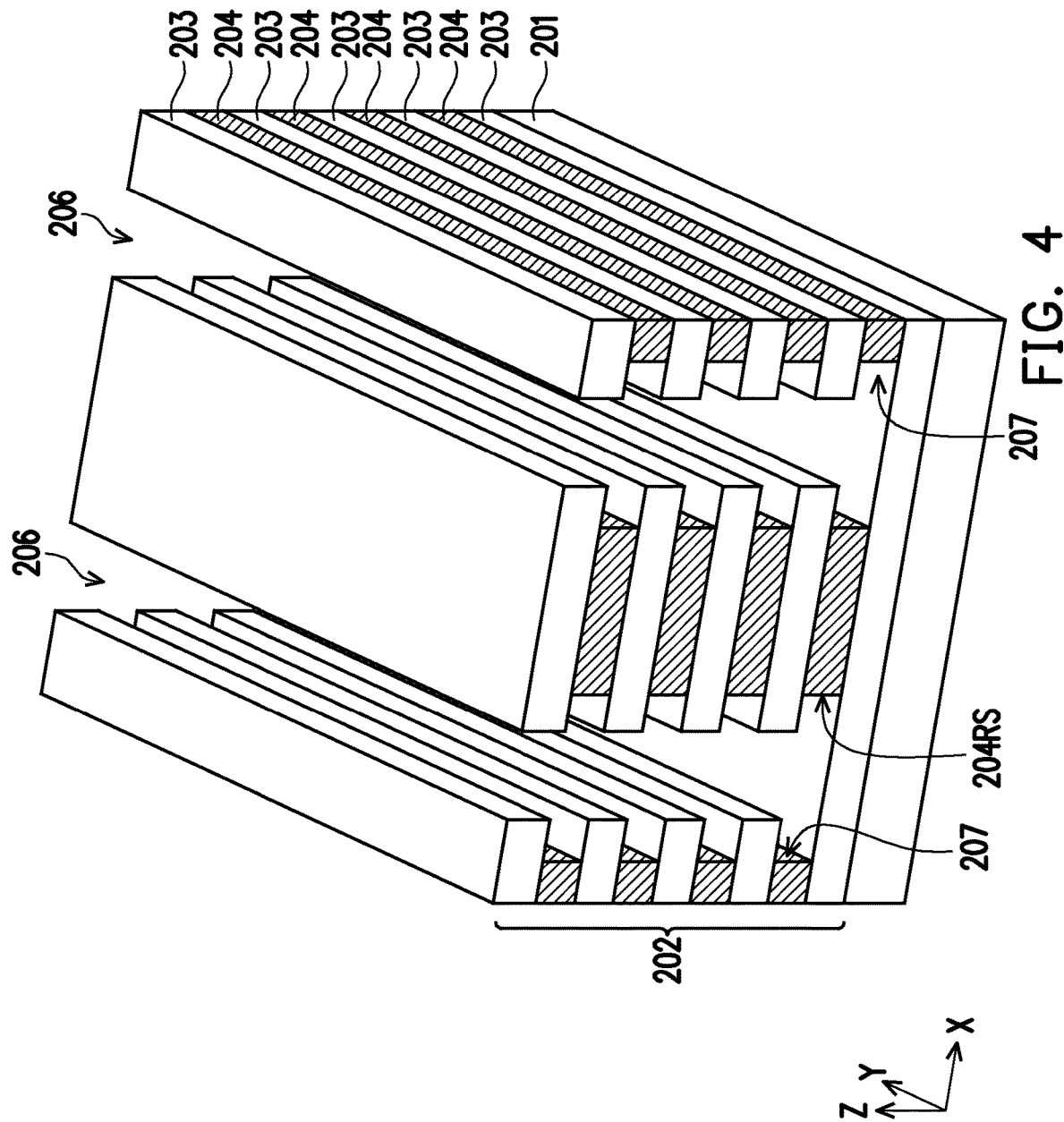

Referring to FIG. 4, an etching process is performed to remove portions of the second dielectric layers 204 from their sidewalls exposed by the first trenches 206. That is, the second dielectric layers 204 are laterally recessed. In some embodiments, the recessed sidewalls 204RS of the second dielectric layers 204 are recessed from the sidewalls of the first dielectric layers 203 to form first sidewall recesses 207. The etching process may include an isotropic or an anisotropic etching process, which selectively etches the material of the second dielectric layers 204 at a faster rate than the material of the first dielectric layers 203. In some embodiments, the etching process may be isotropic, and a wet etching process using phosphoric acid may be performed to form the concave first sidewall recesses 207. In another embodiment, a dry etch process highly selective to the material of the second dielectric layers 204 may be used.

Figure 5:
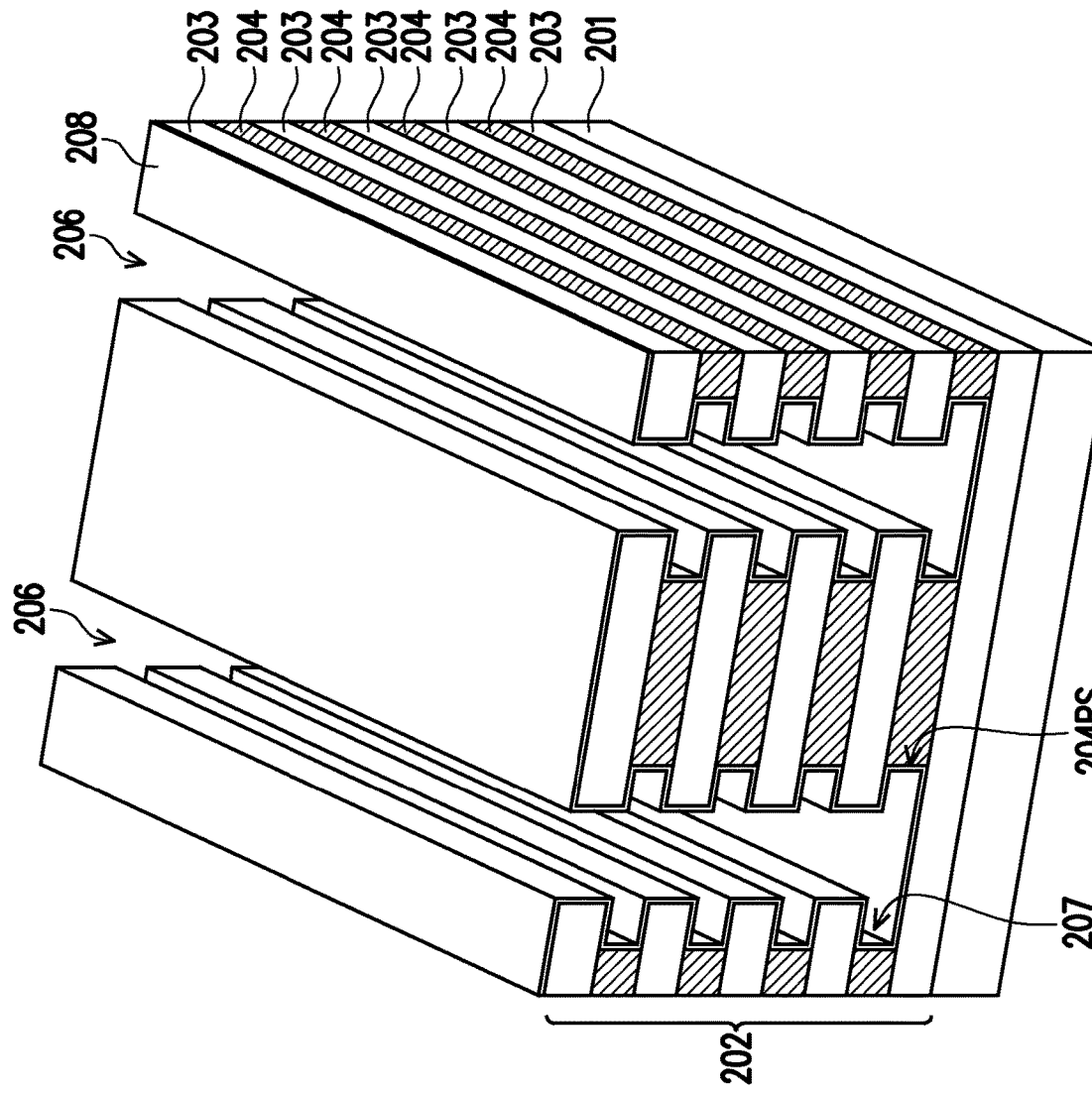

Referring to FIG. 5, a seed layer 208 is formed over exposed surfaces of the first trenches 206 covering the bottommost first dielectric layer 203. In some embodiments, the seed layer 208 is conformally formed over the first trenches 206 and the first sidewall recesses 207, so that the seed layer 208 directly covers the topmost and bottommost first dielectric layers 203 and the sidewalls of the first dielectric layers 203, and covers the recessed sidewalls 204RS of the second dielectric layers 204 without filling up the first sidewall recesses 207. In some embodiments, the seed layer 208 is formed of an electrically conductive material such as a metal nitride, e.g., titanium nitride, tantalum nitride, molybdenum nitride, zirconium nitride, hafnium nitride, or the like, and may be formed using CVD, ALD, or the like. In some embodiments, the material of the seed layer 208 includes titanium nitride or tantalum nitride.

Figure 6:
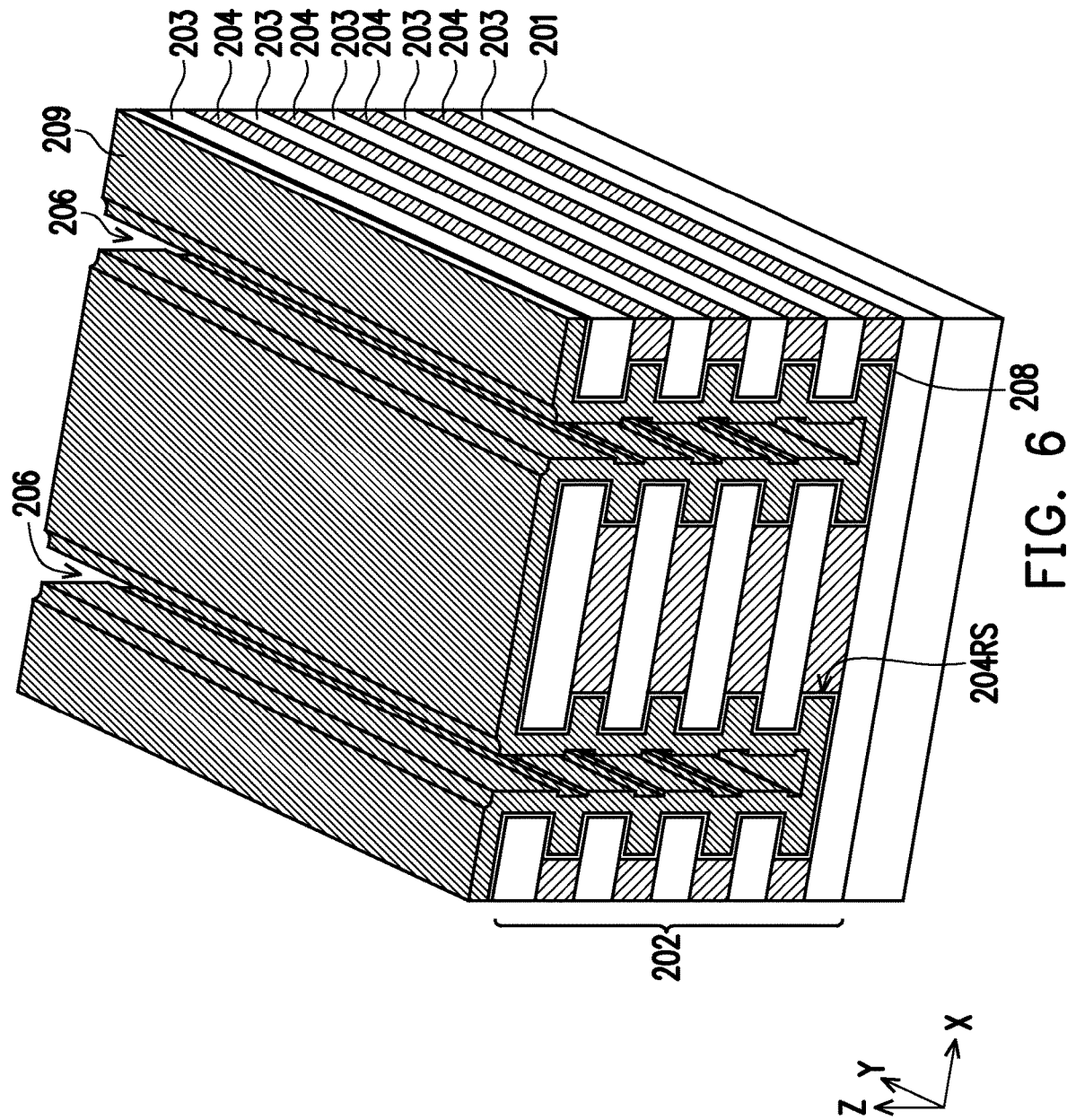

Referring to FIG. 6, a metallic material layer 209 is formed over the seed layer 208. In some embodiments, the material of the metallic material layer 209 includes metals such as tungsten, ruthenium, molybdenum, cobalt, aluminum, nickel, copper, silver, gold, or alloys thereof, or the combinations thereof. In some embodiments, the material of the metallic material layer 209 includes tungsten. The metallic material layer 209 may be formed by a suitable deposition method, such as CVD, PVD, ALD, or the like. In some embodiments, the metallic material layer 209 at least fills the first sidewall recesses 207 but not filling up the first trenches 206.

Figure 7:
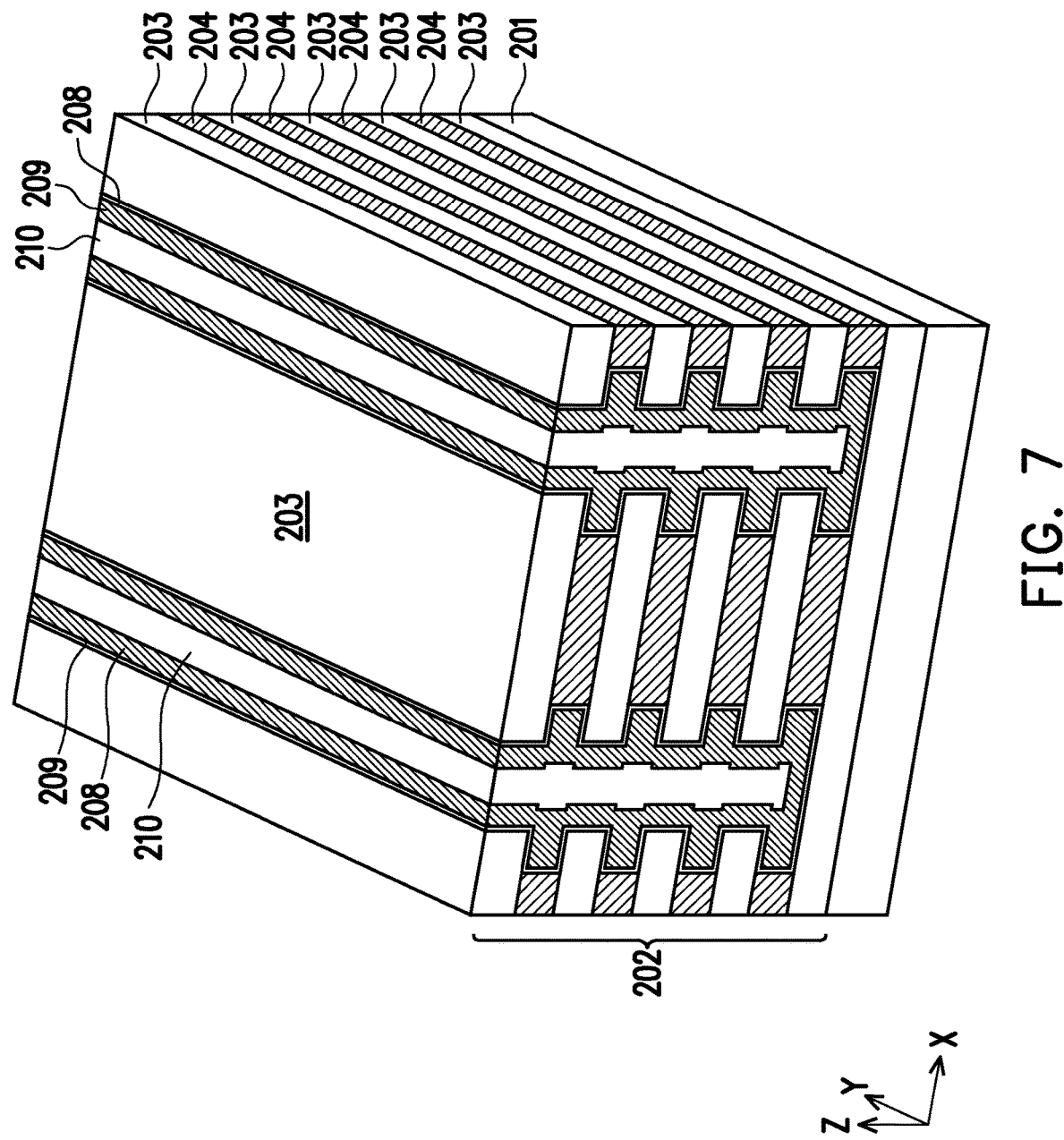

Referring to FIG. 7, dielectric layers 210 are formed on the metallic material layer 209 and filling up the first trenches 206. The formation of the dielectric layers 210 involves forming a dielectric material (not shown) over the metallic material layer 209 and filling the first trenches 206 and then performing a planarization process to remove the extra dielectric material, the metallic material layer 209 and the seed layer 208 above the topmost first dielectric layer 203 so as to form fin-shaped dielectric strips respectively in the first trenches 206. In some embodiments, the material of the dielectric layers 210 may be the same as the material of the first dielectric layers 203. In some embodiments, the material of the dielectric layers 210 may be different from the material of the first dielectric layers 203. In some embodiments, the dielectric layers 210 may be formed by any compatible formation method, such as CVD, PVD, ALD, or the like. In some embodiments, the planarization process includes a chemical mechanical polishing (CMP) process, an etching-back process or a combination thereof.

Figure 8:
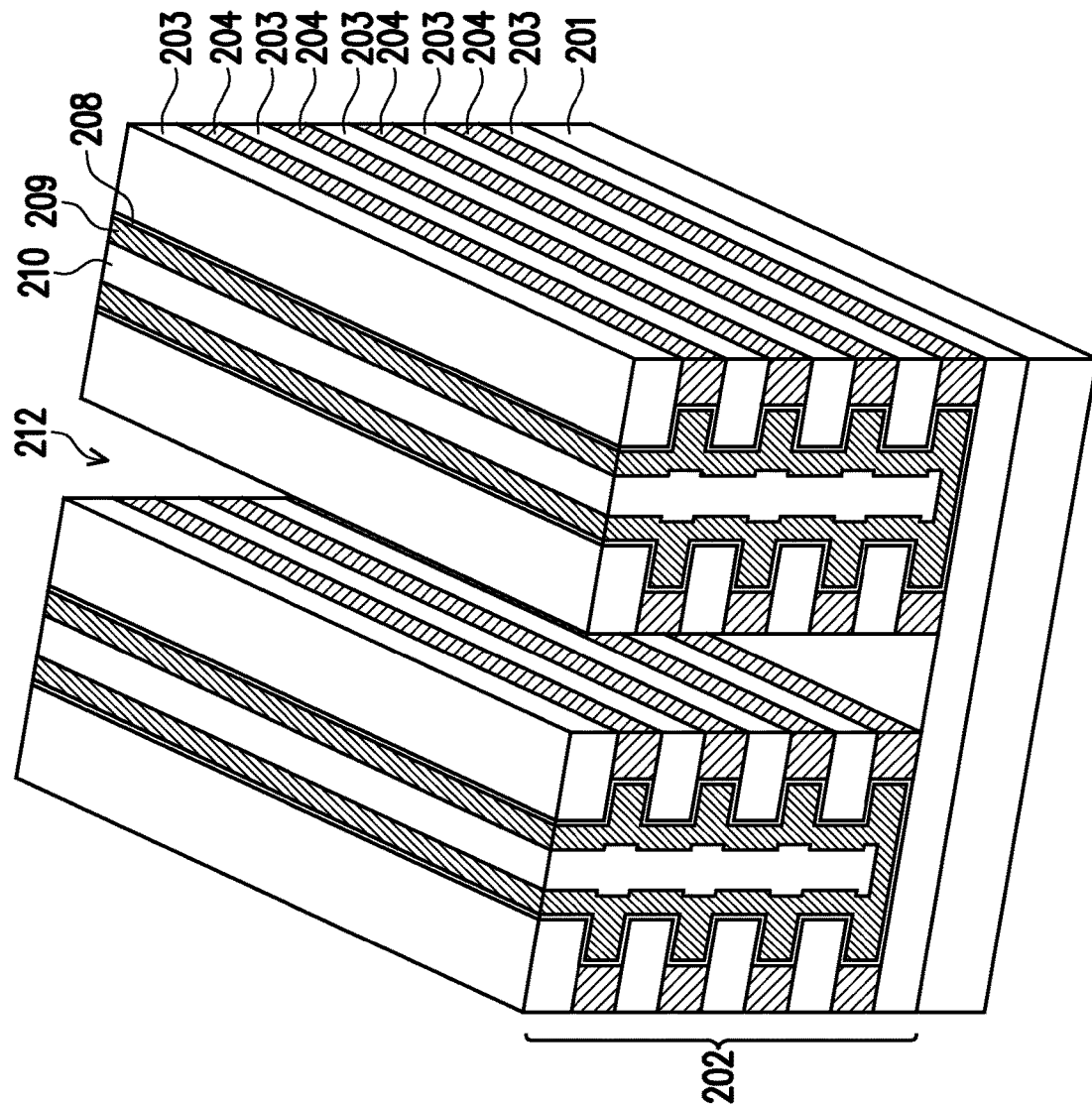

Referring to FIG. 8, another trench forming process is performed and second trenches 212 (only one is shown in FIG. 8) are formed in the stack 202 between the dielectric layers 210 in the first trenches 206 (see FIG. 3). In some embodiments, the trenches 212 are trenches extending in parallel, and the depth, width or configurations of the second trenches 212 are similar to those of the first trenches 206. As seen in FIG. 8, the second trench 212 penetrates through four first dielectric layers 203 and four second dielectric layers 204 (counted from the top) and expose the bottommost first dielectric layer 203. The formation of the trenches 212 may involve similar techniques and process used for forming the trenches 206, and the details will not be repeated herein. In other embodiments, the trenches 212 may penetrate through the whole multilayered stack 202 and expose the dielectric structure 201.

Figure 9:
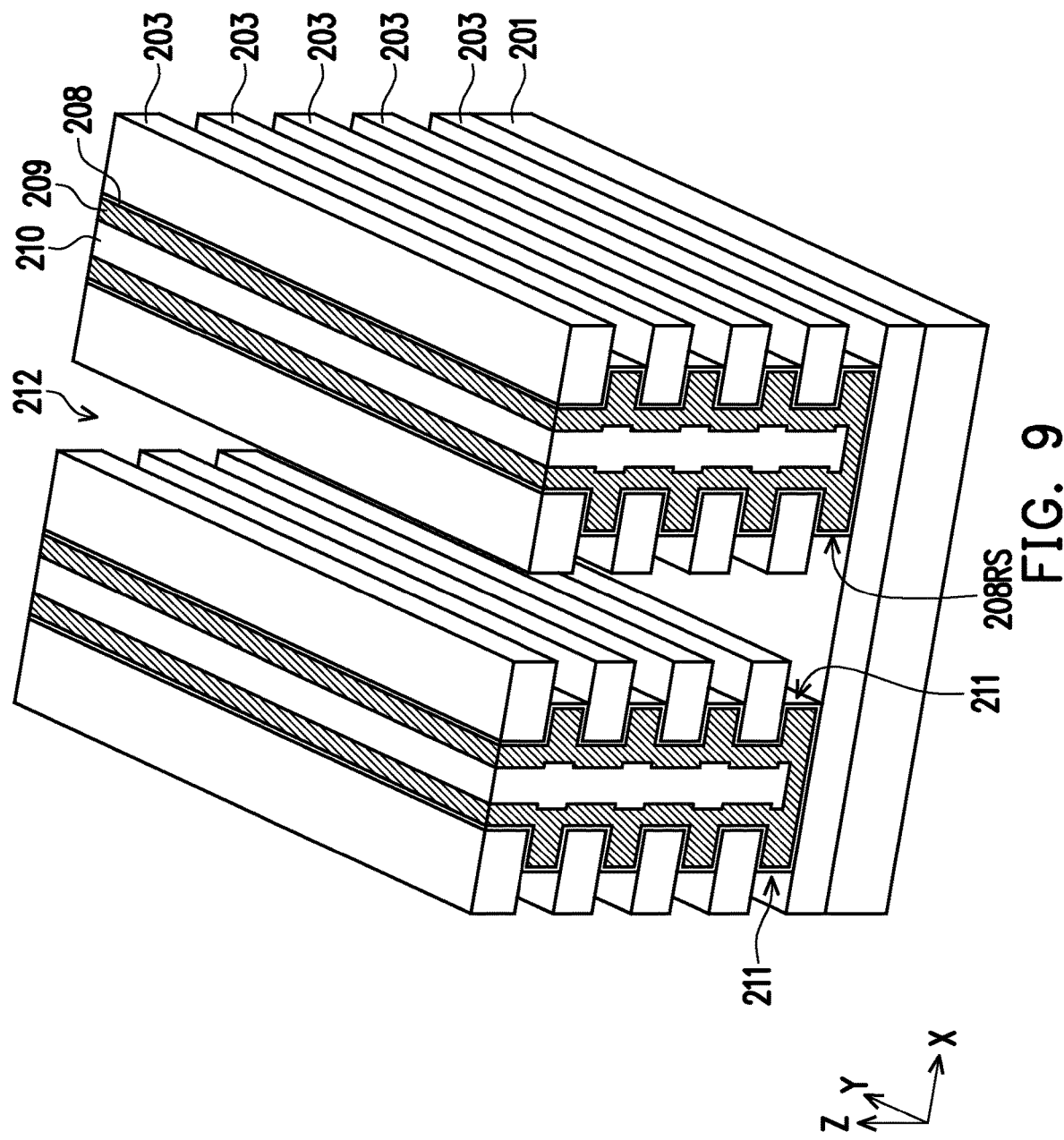

Referring to FIG. 9, in some embodiments, an etching process is performed to remove portions of the second dielectric layers 204 from their sidewalls exposed by the second trench(es) 212. That is, the second dielectric layers 204 are laterally etched until the seed layer 208 is exposed. In some embodiments, after etching off the remaining second dielectric layer 204, second sidewall recesses 211 are formed between the protruded portions of the first dielectric layer 203 and the sidewalls 208RS of the seed layer 208 are exposed. The etching process may include an isotropic or an anisotropic etching process, which selectively etches the material of the second dielectric layers 204 at a faster rate than the material of the first dielectric layers 203. In some embodiments, the etching process may be similar to the etching process described in FIG. 4, and such etching process stops at the seed layer 208. In general, the second dielectric layers 204 are completely removed without remainings or residues.

Figure 10:
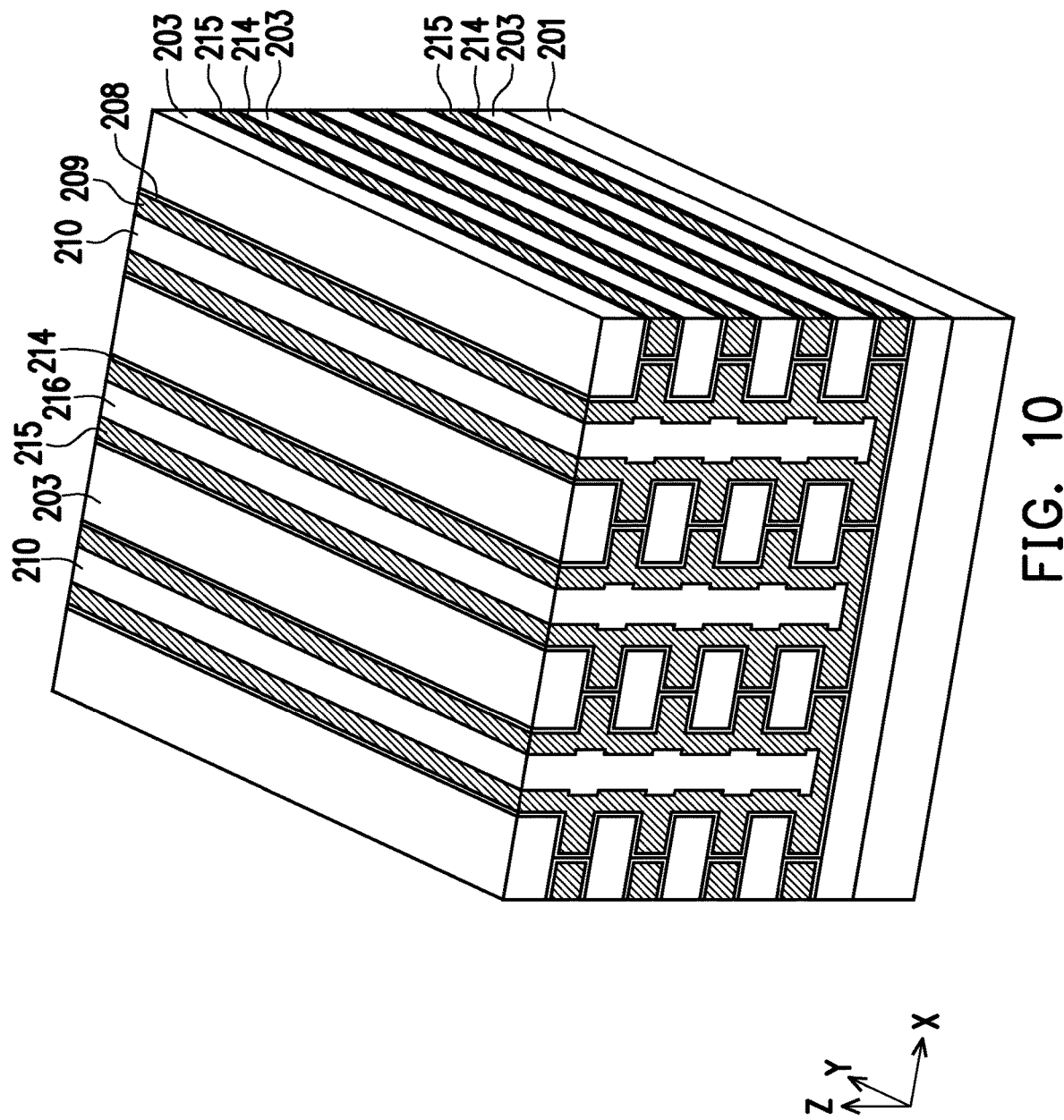

Referring to FIG. 10, a seed layer 214 is formed over exposed surfaces of the second trench(es) 212 covering the bottommost first dielectric layer 203. In some embodiments, the seed layer 214 conformally covers the second trench(es) 212 and the second sidewall recesses 211, so that the seed layer 214 conformally covers the protruded portions of the first dielectric layers 203, and covers the sidewalls 208RS of the seed layer 208 without filling up the second sidewall recesses 211. Later, a metallic material layer 215 is formed over the seed layer 214. In some embodiments, the metallic material layer 215 at least fills the second sidewall recesses 211 but not filling up the second trench(es) 212. In some embodiments, a dielectric layer 216 is later formed on the metallic material layer 215 and filling up the second trench 212. In some embodiments, the dielectric layer 216 are formed as a fin-shaped dielectric strip individually located in the second trench 212. In some embodiments, the material of the dielectric layer 216 may be the same as the material of the dielectric layer 210 or the material of the first dielectric layers 203. The formation of the seed layer 214, the metallic material layer 215 and the dielectric layer 216 involves similar methods and materials used for forming the seed layer 208, the metallic material layer 209 and the dielectric layer 210 described from FIG. 5 to FIG. 7, and the details will be skipped herein.

Figure 11:
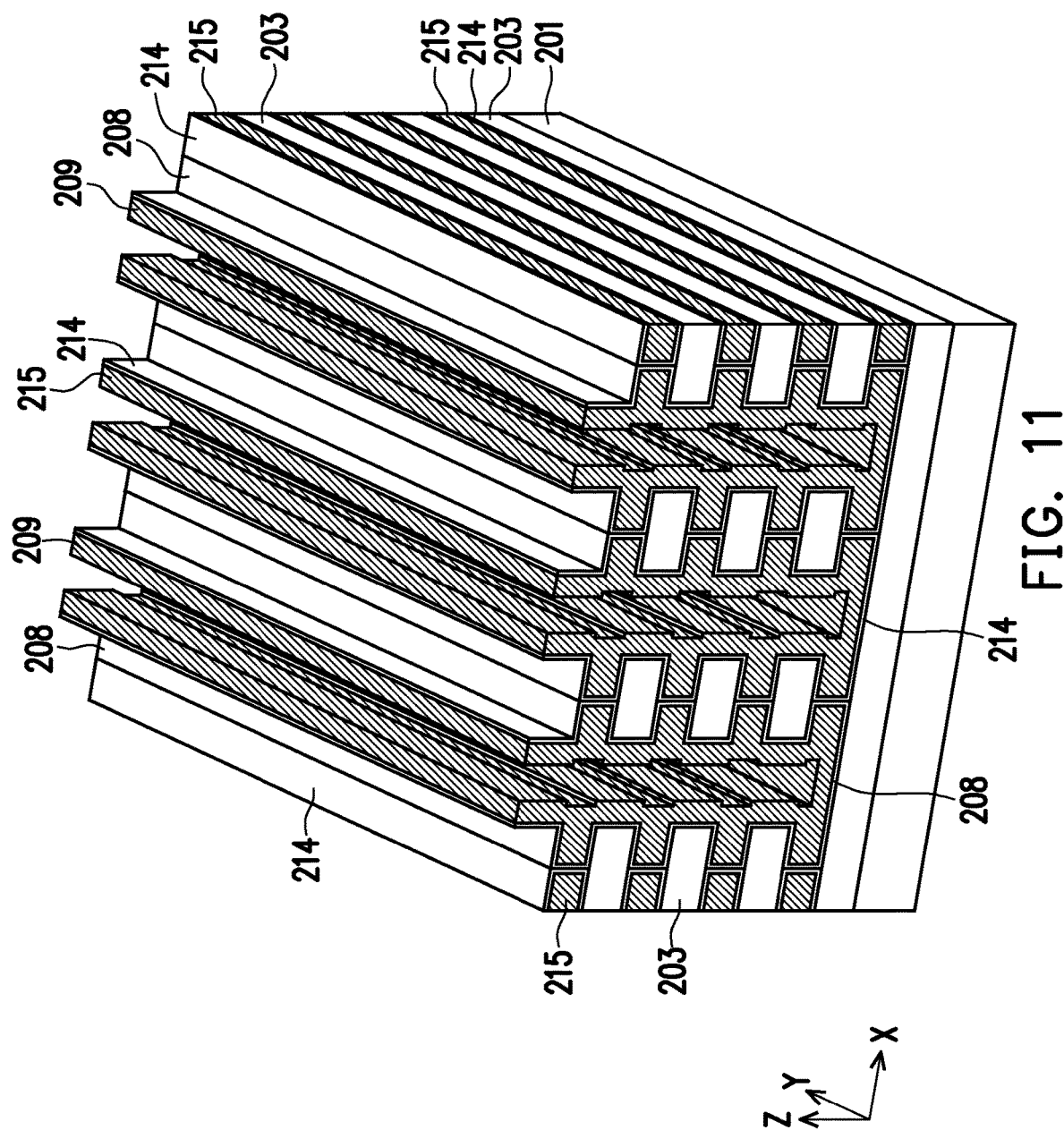

Referring to FIG. 11, a pulling back process is performed to remove the dielectric layers 210 and 216. In some embodiments, the dielectric layers 210 and 216 within the trenches 206 and 212 are removed to expose the metallic material layers 209 and 215. Also, the topmost first dielectric layer 203 is removed during the pulling back process. In some embodiments, the pulling back process including a suitable etching process to remove the exposed first dielectric layer 203 (i.e. the topmost first dielectric layer), so that the seed layers 208 and 214 are exposed. The etching process may include an isotropic or an anisotropic etching process, which selectively etches the material of the first dielectric layers 203 and/or the material of the dielectric layer 210 and 216, and such etching process stops at the seed layers 208, 214 and the metallic material layers 209 and 215.

Figure 12:
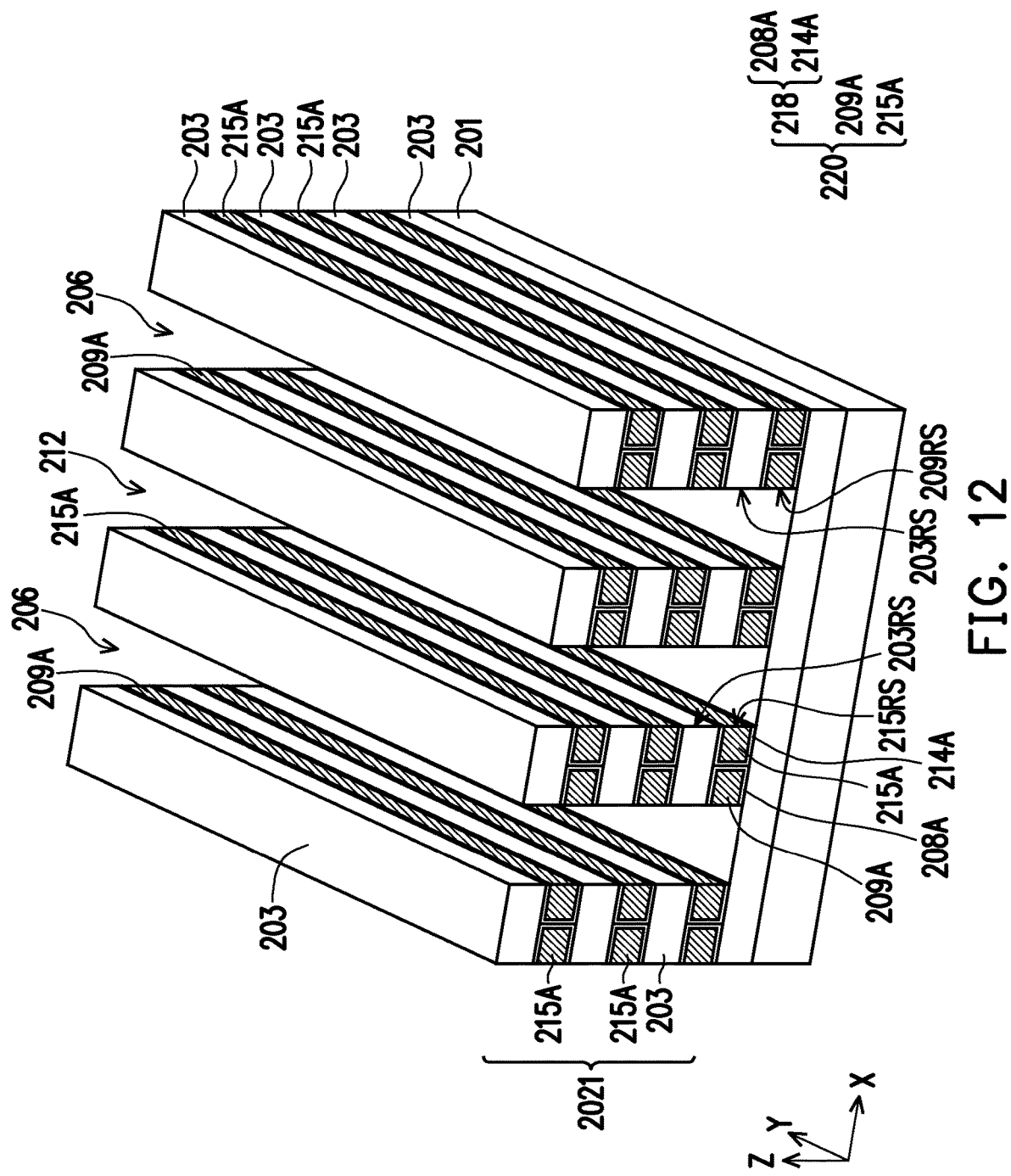

Referring to FIG. 12, a patterning process is performed to remove the extra seed layers 208 and 214 and the metallic material layers 209 and 215 above the fourth first dielectric layer 203 (counted upward from the dielectric structure 201) and beyond the protruded portions of the first dielectric layers 203 in the first and second trenches 206 and 212 until the bottommost first dielectric layer 203 is exposed from the trenches 206 and 212. In FIG. 12, after the patterning process, portions of the seed layers 208 and 214 and portions of the metallic material layers 209 and 215 disposed within the sidewall recesses (or disposed within lateral coverage of the first dielectric layers 203) remain and become respectively the seed portions 208A and 214A and metallic portions 209A and 215A, and other portions of the seed layers 208 and 214 and the metallic material layers 209 and 215 (e.g., portions disposed outside the sidewall recesses) are removed through the patterning process. As illustrated in FIG. 12, after patterning, the seed portions 208A/214A extends along three sides (e.g., the top surface, a sidewall, and the bottom surface) of a corresponding metallic portions 209A/215A. In some embodiments, the seed portions 208A and 214A are referred to as seed liners 218, while the seed liners 218 and the metallic portions 209A and 215A are referred to as metallic features 220. In FIG. 12, after the patterning process, the sidewalls 209RS and 215RS of the metallic portions 209A and 215A are exposed through the first and second trenches 206 and 212. In some embodiments, the sidewalls 203RS of the first dielectric layers 203 are vertically substantially aligned with the sidewalls 209RS and 215RS of the metallic portions 209A and 215A. In some embodiments, the patterning process includes performing one or more etching processes. In some embodiments, the patterning process may involve using suitable photolithography and etching techniques, such as performing an anisotropic etching process using a mask and followed by a planarization process (such as CMP). Herein, the trenches formed during the patterning process are major trenches but may be referred to as the trenches 206 and 212, it is because these trenches have the similar dimensions and locations of the first and second trenches 206 and 212 in this embodiment. The formation of these trenches involves using photolithographic and etching techniques, such as using a time-controlled etching process so as to stop at the bottommost first dielectric layer 203. For example, the etch process includes a dry etching process such as a RIE process.

The above-described processes may be regarded the replacement process for replacing the second dielectric layers 204 with the metallic features 220, and the metallic features 220 may function as word lines of the memory device. In FIG. 12, four stacks 2021 are shown located on the bottommost first dielectric layer 203 and these stacks 2021 are separated by the major trenches (i.e., first and second trenches 206 and 212), but the number of the stacks 2021 depends on the number of the trenches and may vary depending on the layout design. Although the four stacks 2021 are shown with straight sidewalls, it is understood that the sidewall profiles may be slanted or slightly curved. In FIG. 12, each multilayered stack 2021 includes three layers of the first dielectric layers 203 and three layers of the composite structure of the metallic features 220 are alternately sandwiched between the first dielectric layers 203. It is comprehended that the number of the first dielectric layers 203 and the layer number of the metallic features 220 may be any suitable number and may be adjusted based on product design. In some embodiments, the metallic features 220 have a same or similar overall thickness T2 as the second dielectric layers 204, and have a width the same with or similar to the lateral depth of the sidewall recesses 208.

Figure 13:
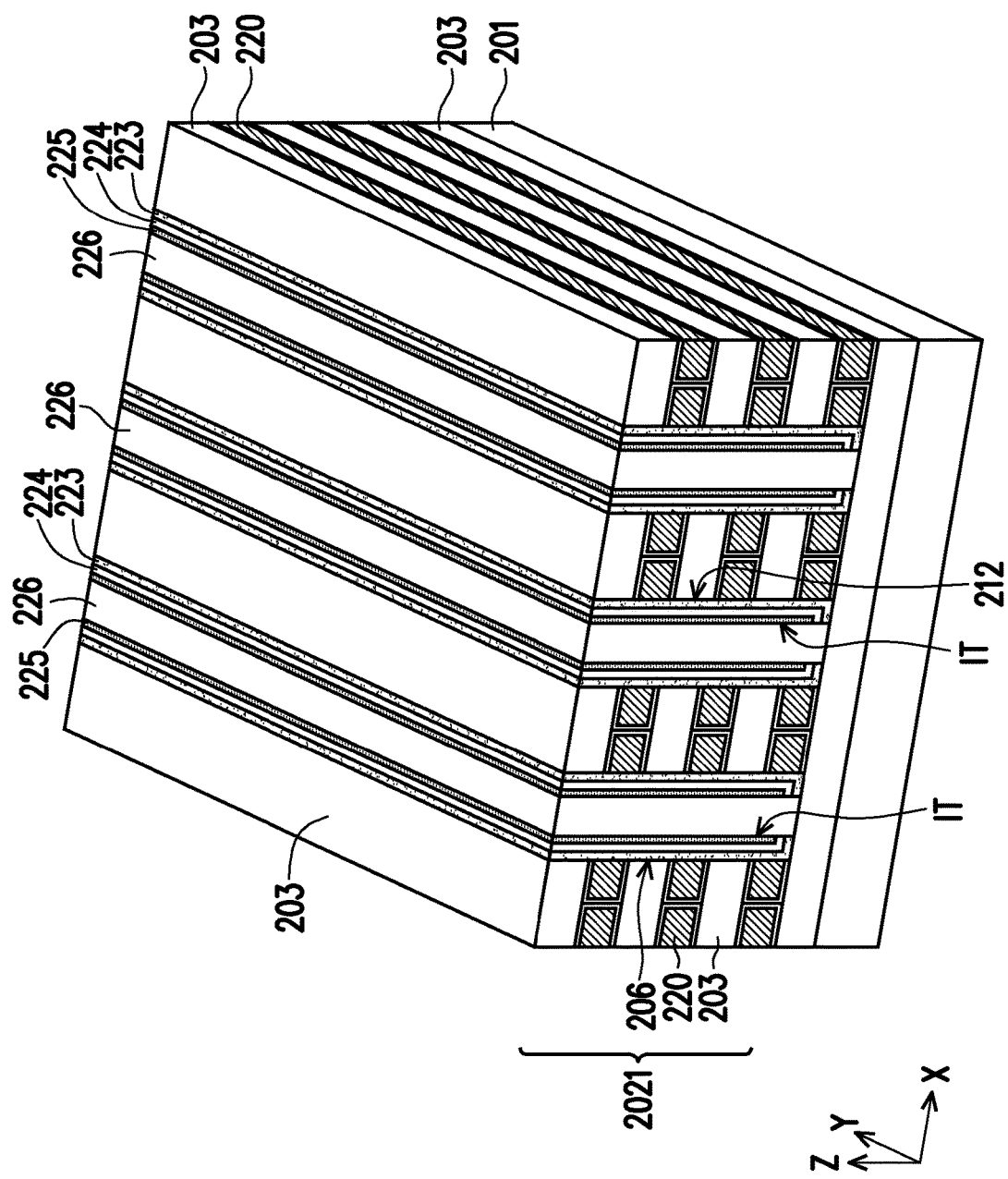

Referring to FIG. 13, in some embodiments, a ferroelectric layer 223 is formed on the sidewalls and bottoms of the trenches 206 and 212, a channel material layer 224 is formed over the ferroelectric layer 223 and a gate dielectric layer 225 is formed over the channel material layer 224 and then a dielectric layer 226 is formed to fill the trenches 206 and 212. In some embodiments, the formation process involves forming a ferroelectric material (not shown) conformally to line the sidewalls and bottoms of the trenches 206 and 212, forming a channel material (not shown) conformally over the ferroelectric material, forming a gate dielectric material (not shown) conformally over the channel material, patterning the ferroelectric material, the channel material and the gate dielectric material to form inner trenches IT and to expose the bottommost first dielectric layer 203, and then a dielectric material (not shown) is formed to fill up the inner trenches IT. Through the formation of the inner trenches IT, the later filled dielectric layers 226 physically split up the sequentially formed ferroelectric material, channel material and gate dielectric material into two parts (i.e. left and right parts located respectively on left and right sidewalls of the trenches 206, 212). Afterwards, a planarization process, such as a CMP process, may be performed to remove excess portions of the ferroelectric material, the channel material, the gate dielectric material and the dielectric material from the upper surfaces of the multilayered stack 2021. As a result, the upper surfaces of the stacks 2021 are coplanar with the ferroelectric layer(s) 223, the channel material layer(s) 224, the gate dielectric layer(s) 225 and the dielectric layer(s) 226. In some embodiments, as depicted in FIG. 13, the ferroelectric layer 223, the channel material layer 224, the gate dielectric layer 225 located at left side of the dielectric layer 226 are physically separate from the ferroelectric layer 223, the channel material layer 224, the gate dielectric layer 225 located at right side of the dielectric layer 226 in the same trench. In alternative embodiments, depending on the trench depth in the multilayered stack, although the channel material formed in the trench is split up by the later-formed dielectric material but the ferroelectric material formed in the same trench is intact but not split by the dielectric material.

In some embodiments, the ferroelectric material of the ferroelectric layer 223 includes hafnium zirconium oxide (HfZrO), zirconium oxide (ZrO), undoped hafnium oxide (HfO) or HfO doped with lanthanum (La), silicon (Si), aluminum (Al), or the like. In some embodiments, the ferroelectric layer 223 may be formed by a suitable deposition process such as ALD, CVD, PVD, or the like. In some embodiments, the channel material of the channel material layer 224 includes zinc oxide (ZnO), indium tungsten oxide (InWO), indium gallium zinc oxide (IGZO), indium zinc oxide (IZO), indium tin oxide (ITO) or zinc tin oxide (ZTO). In some embodiments, the formation of the channel material layer 224 includes performing one or more deposition processes selected from CVD, ALD, and PVD. In some embodiments, the material of the gate dielectric layer 225 includes one or more high-k dielectric materials, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or combinations thereof. In some embodiments, the gate dielectric layer 225 includes one or more materials selected from aluminum oxide, hafnium oxide, tantalum oxide and zirconium oxide. In some embodiments, the formation of the gate dielectric layer 225 includes performing one or more deposition processes selected from CVD (such as, PECVD and laser-assisted CVD), ALD and PVD (such as, sputtering and e-beam evaporation).

In some embodiments, the dielectric layer 226 is formed of one or more acceptable dielectric materials including silicon oxide, silicon nitride, silicon carbide, silicon oxynitride, silicon oxycarbide, silicon carbonitride, or the like. In some embodiments, the material of the dielectric layers 226 may be the same as the material of the first dielectric layers 203. In some embodiments, the material of the dielectric layers 226 may be different from the material of the first dielectric layers 203.

Figure 14:
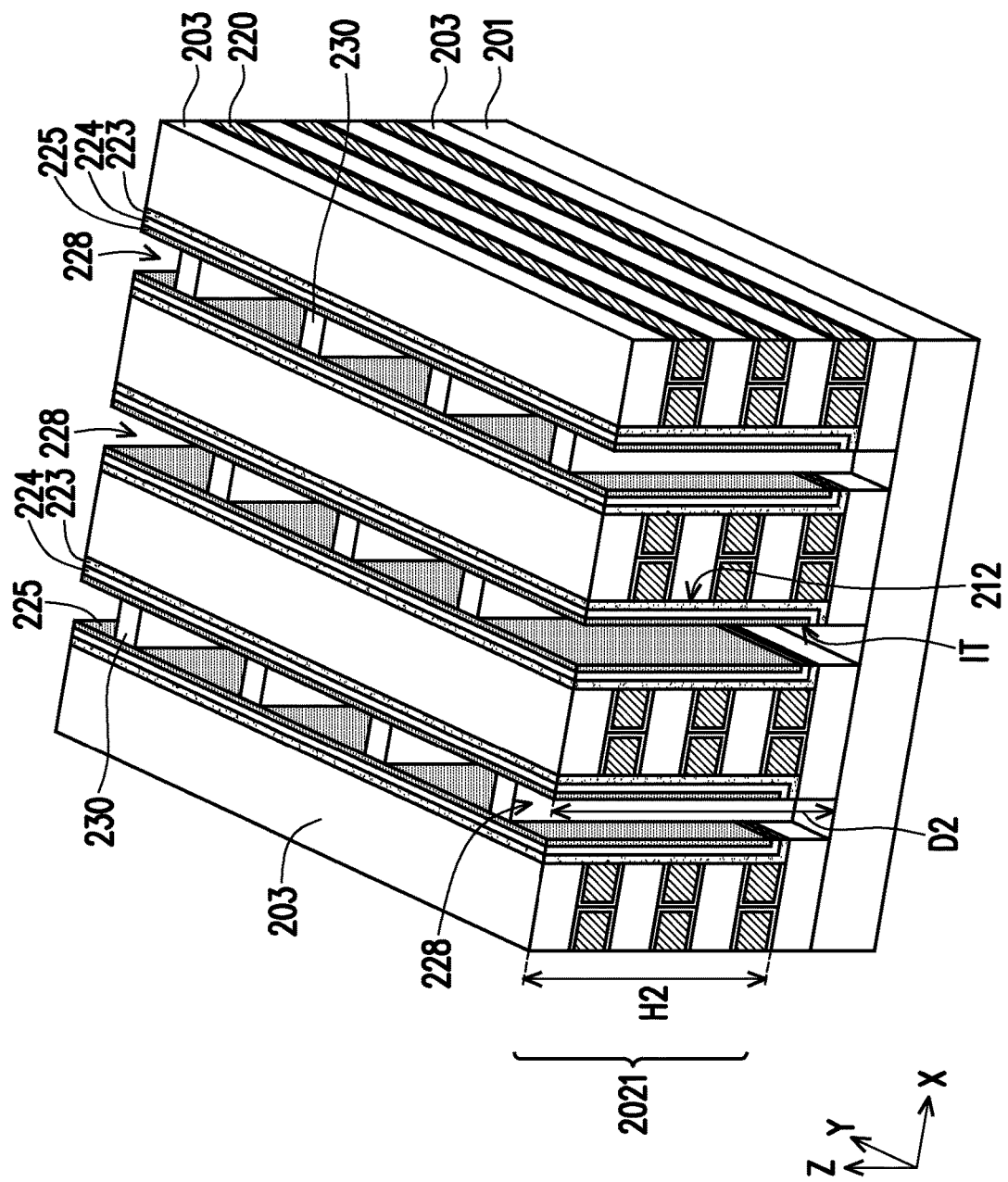

Referring to FIG. 14, an etching process is performed to the dielectric layers 226 to form trench openings 228 in the dielectric layers 226. In some embodiments, the etching process is selective and does not remove the ferroelectric layers 223, the channel material layers 224 and the gate dielectric layers 225. In some embodiments, the trench openings 228 vertically extend through the dielectric layers 226 and beyond the stack 2021 and penetrate through the bottommost first dielectric layer 203 to expose the dielectric structure 201. The performed etching process may selectively remove the materials of the dielectric layers 226 and 203 and stop at the dielectric structure 201. The trench openings 228 may be formed using the same or similar processes for the previous trenches, and thus details are not repeated herein. As illustrated in FIG. 14, since the trench openings 228 penetrate through the dielectric layers 226 and the bottommost first dielectric layer 203, the remained dielectric blocks 230 vertically extend through the stack 2021 and the bottommost first dielectric layer 203. In FIG. 14, each dielectric block 230 is sandwiched between the opposing gate dielectric layers 225 of the corresponding trench, and the dielectric blocks 230 are separate from one another with a distance. In some embodiments, each trench openings 228 has a depth D2 larger than the height H2 of the stack 2021.

Figure 15:
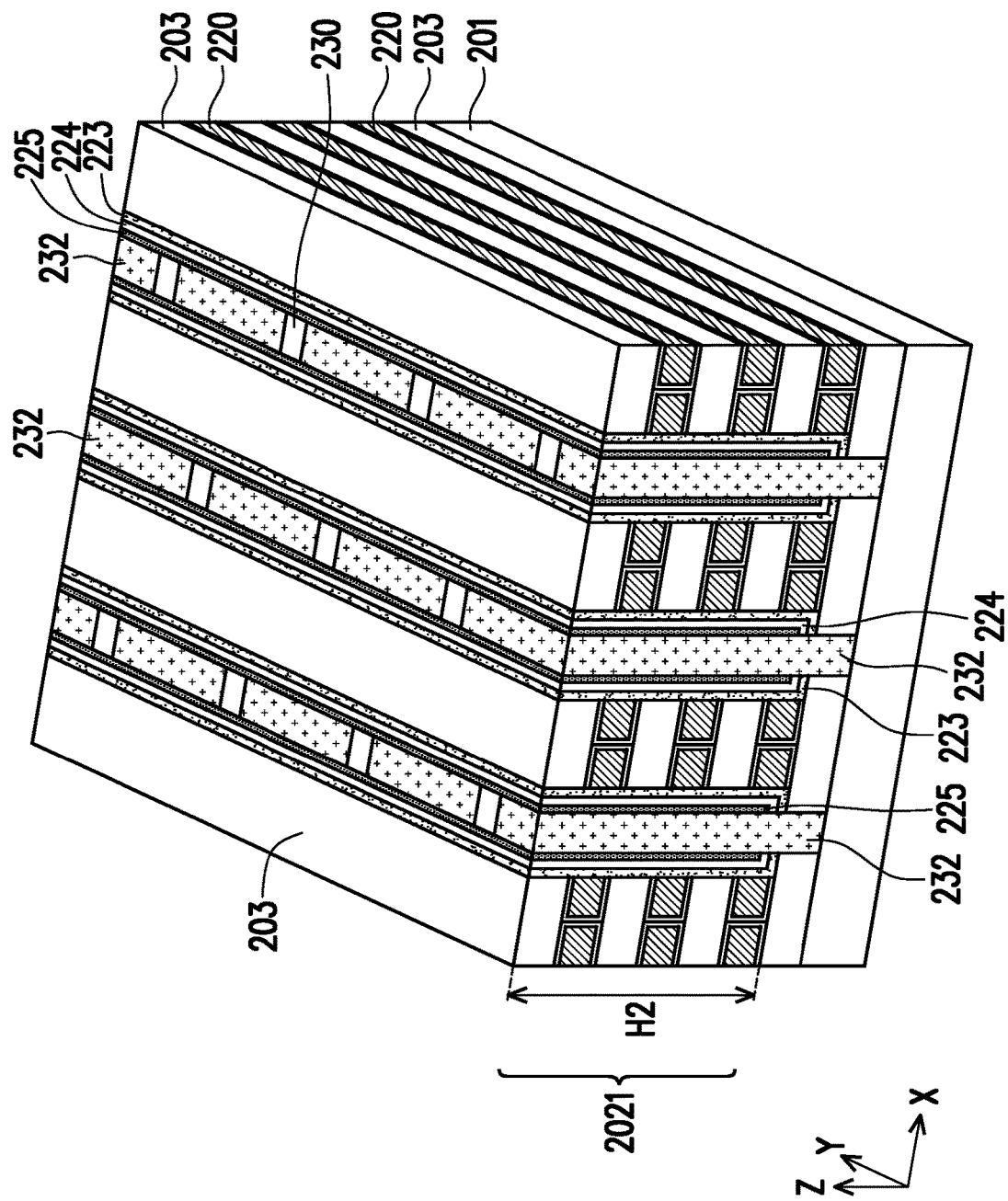

Referring to FIG. 15, insulation layers 232 are formed to fill up the trench openings 228. For example, the formation of the insulation layers 232 involves forming an insulating material over the stacks 2021 and filling up the trench openings 228 and performing a planarization process to remove the extra insulating material outside the trench openings 228. In some embodiments, the material for forming the insulation layer 232 includes silicon oxide, silicon nitride, silicon oxynitride, silicon carbide, silicon oxycarbide, silicon carbonitride, or the combination thereof. In one embodiment, the insulating material of the insulation layers 232 includes silicon nitride. In some embodiments, the insulation layers 232 are formed by any compatible formation method, such as coating, CVD, PVD, ALD or the like.

Figure 16:
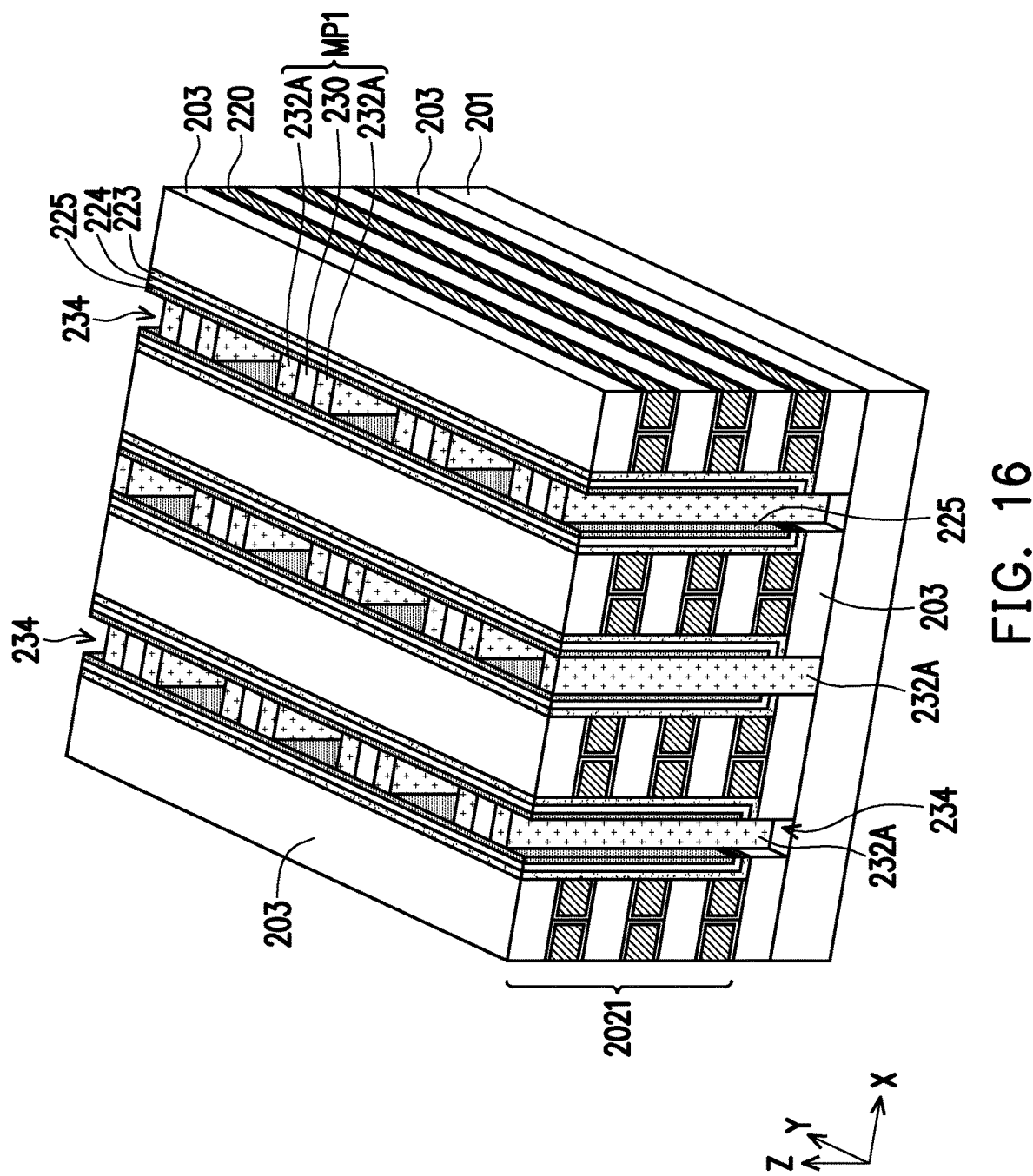

Referring to FIG. 16, an etching process is performed to the insulation layers 232 to form trench openings 234 in the insulation layers 232, and the gate dielectric layers 225 are exposed. In some embodiments, the etching process is selective and does not remove the ferroelectric layers 223, the channel material layers 224 and the gate dielectric layers 225. In some embodiments, the trench openings 234 vertically extend through insulation layers 232 to expose the dielectric structure 201. The performed etching process may selectively remove the materials of the insulation layers 232 and stop at the dielectric structure 201. The trench openings 234 may be formed using the same or similar processes for the previous trenches, and thus details are not repeated herein. As illustrated in FIG. 16, since the trench openings 234 penetrate through the insulation layers 232 to expose the dielectric structure 201, the remained insulation blocks 232A vertically extend along the dielectric blocks 230 to reach the dielectric structure 201. In FIG. 16, the insulation blocks 232A are separate from one another with a distance, and each dielectric block 230 is sandwiched between two insulation blocks 232A in the corresponding trench to form a mask pattern MP1. In some embodiments, each trench openings 234 has a depth about the same as the depth D2 of the trench openings 228.

Figure 17:
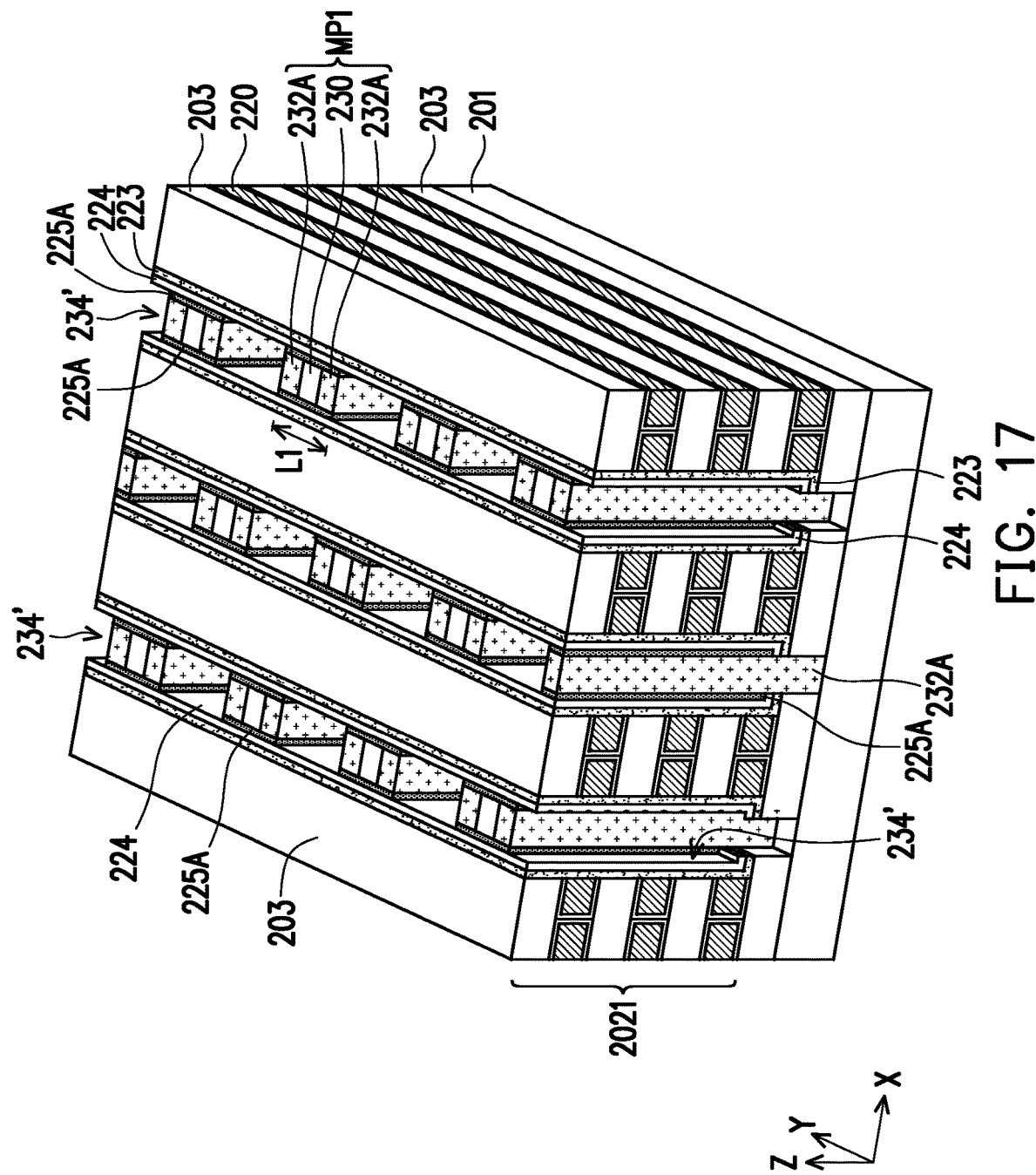

Referring to FIG. 17, using the mask patterns MP1 (the combination of dielectric blocks 230 and the insulation blocks 232A) as the etching masks, the exposed gate dielectric layers 225 are selectively removed by a selective etching process. In some embodiments, the selective etching process selectively removes the exposed gate dielectric layers 225 and does not remove the adjacent channel material layers 224 and ferroelectric layers 223. In some embodiments, the remained gate dielectric layers 225A do not extend beyond the mask patterns MP1 along the extending direction (Y-direction). That is, the extending length of the gate dielectric layer 225A is substantially the same as the total lengths of the mask pattern MP1 along the trench extending direction (Y-direction). In some embodiments, the gate dielectric layer 225A has an extending length L1 along the trench extending direction (Y-direction). In some embodiments, by selectively removing the exposed gate dielectric layer 225, the trench openings 234 are enlarged to become the trench openings 234', the channel material layers 224 are exposed, and the trench openings 234' are located between the opposing channel material layers 224.

Figure 18:
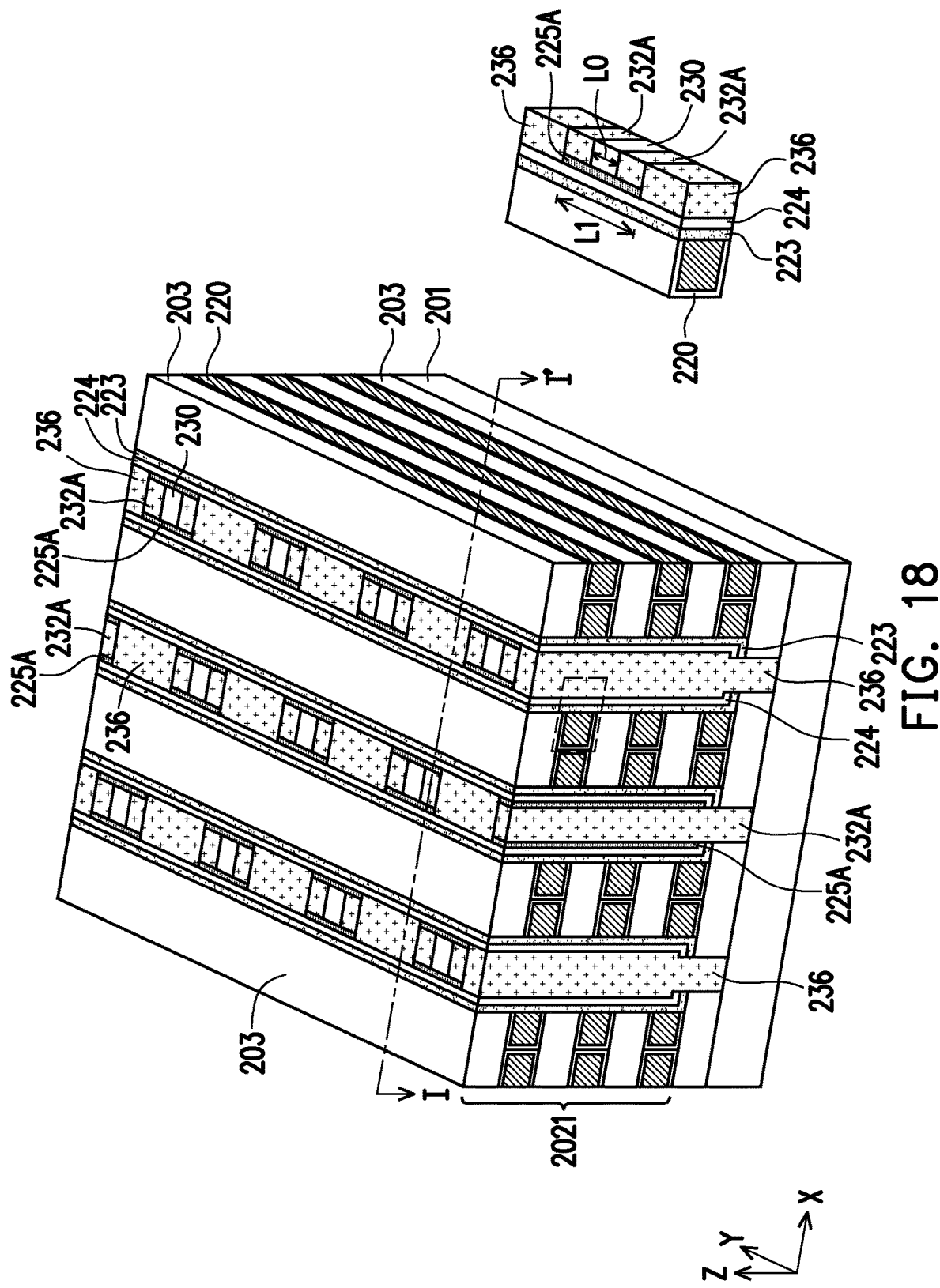

Referring to FIG. 18, insulation layers 236 are formed to fill up the trench openings 234' and are in contact with the exposed channel material layers 224. For example, the formation of the insulation layers 236 involves forming an insulating material over the stacks 2021 and filling up the enlarged trench openings 234' and performing a planarization process to remove the extra insulating material outside the trench openings 234'. In some embodiments, the material for forming the insulation layer 236 includes silicon oxide, silicon nitride, silicon oxynitride, silicon carbide, silicon oxycarbide, silicon carbonitride, or the combination thereof. In one embodiment, the insulating material of the insulation layers 236 includes silicon nitride. In some embodiments, the insulation layers 236 are formed by any compatible formation method, such as coating, CVD, PVD, ALD or the like. From the enlarged partial 3D view of a portion (enclosed by the dotted line to represent a cell unit) of the structure as shown at the right side of FIG. 18, it is seen that the gate dielectric layer 225A has a length L1 and extends along the sidewalls of the insulation blocks 232A and the dielectric block 230 along the Y-direction, while the dielectric block 230 has an extending length L0 along the Y-direction. In some embodiments, the insulation layers 236 filled in the trench openings 234' are located between the insulation blocks 232A and between the channel material layers 224. In some embodiments, the length L1 of the gate dielectric layer is larger than the length L0 of the dielectric block 230. In some embodiments, the length L0 ranges from about 1 nm to about 100 nm, the length L1 ranges from about 3 nm to about 2500 nm.

Figure 19:
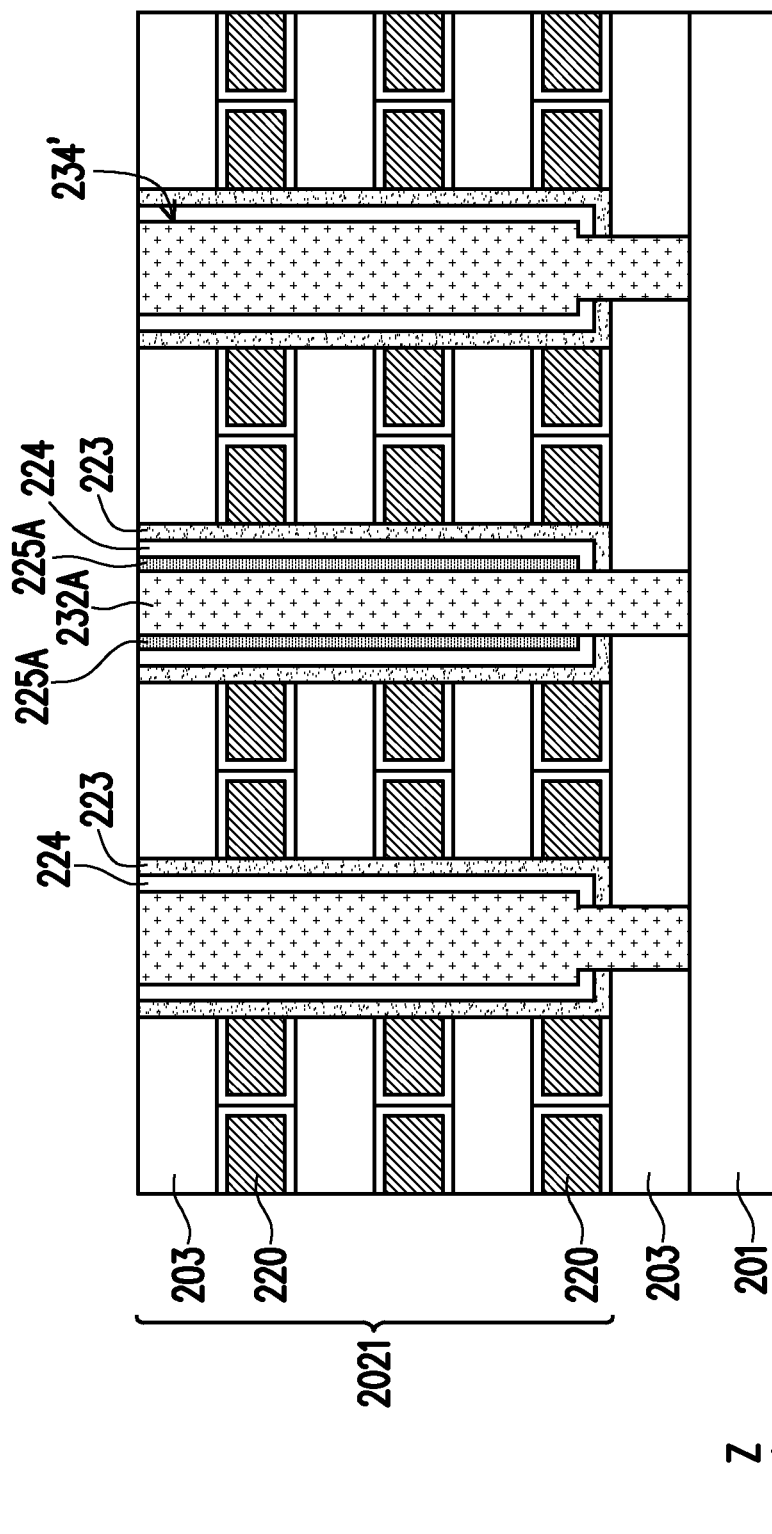

FIG. 19 is a schematic cross-sectional view showing the structure of FIG. 18 along the X-direction crossline I-I'. Referring to FIG. 19, in some embodiments, the insulation layers 236 and the insulation blocks 232A vertically (along the Z-direction) penetrate through the stacks 2021 and the bottommost first dielectric layer 203 to reach the dielectric structure 201. In the cross-sectional view of FIG. 19, two separate gate dielectric layers 225A are located on two opposing sidewalls of the insulation block 232A.

Figure 20:
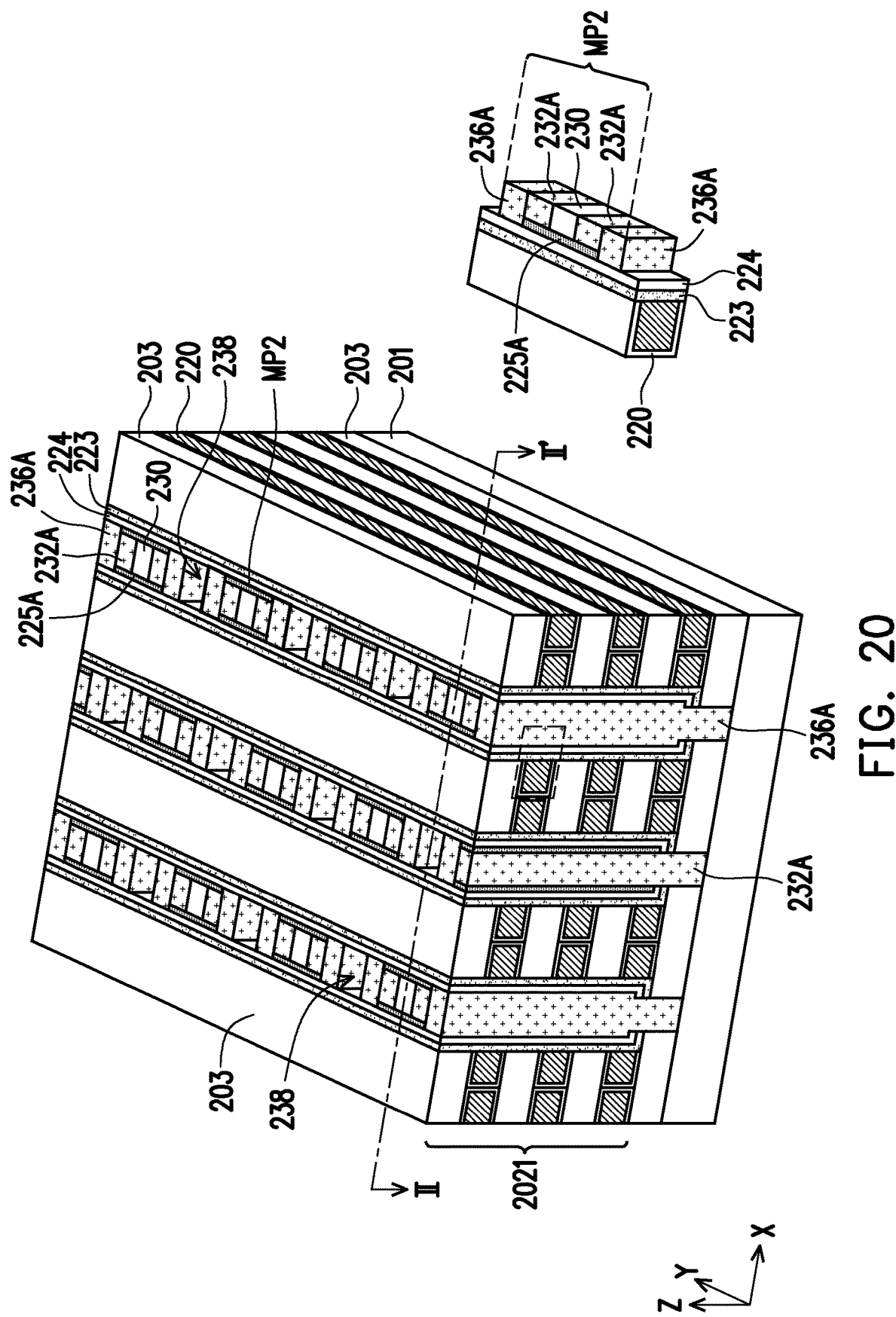

Referring to FIG. 20, an etching process is performed to the insulation layers 236 to form trench openings 238 in the insulation layers 236, and the channel material layers 224 are exposed by the trench openings 238. In some embodiments, the etching process is selective and does not remove the ferroelectric layers 223, the channel material layers 224 and the gate dielectric layers 225A. In some embodiments, the trench openings 238 vertically extend through insulation layers 236 to expose the dielectric structure 201. The performed etching process may selectively remove the materials of the insulation layers 236 and stop at the dielectric structure 201. The trench openings 238 may be formed using the same or similar processes for the previous trenches, and thus details are not repeated herein. As illustrated in FIG. 20, since the trench openings 238 penetrate through the insulation layers 236 to expose the dielectric structure 201, the remained insulation blocks 236A vertically extend along the dielectric blocks 230 and the insulation blocks 232A to reach the dielectric structure 201. In FIG. 20, the insulation blocks 236A are separate from one another with a distance. From the enlarged partial 3D view of a portion (enclosed by the dotted line to represent a cell unit) of the structure as shown at the right side of FIG. 20, it is seen that the blocks 232A/230/232A (i.e. mask pattern MP1) and the gate dielectric layers 225A located at their both sides are sandwiched by two insulation blocks 236A to form a mask pattern MP2. In some embodiments, each trench opening 238 has a depth about the same as the depth D2 of the trench openings 228.

In the following schematic three-dimensional views of FIGS. 21-22 and 24-26, the structures are partially sectioned and cross-sectioned along the cross-section line II-II' of the structure of FIG. 20 for illustration purposes.

Figure 21:
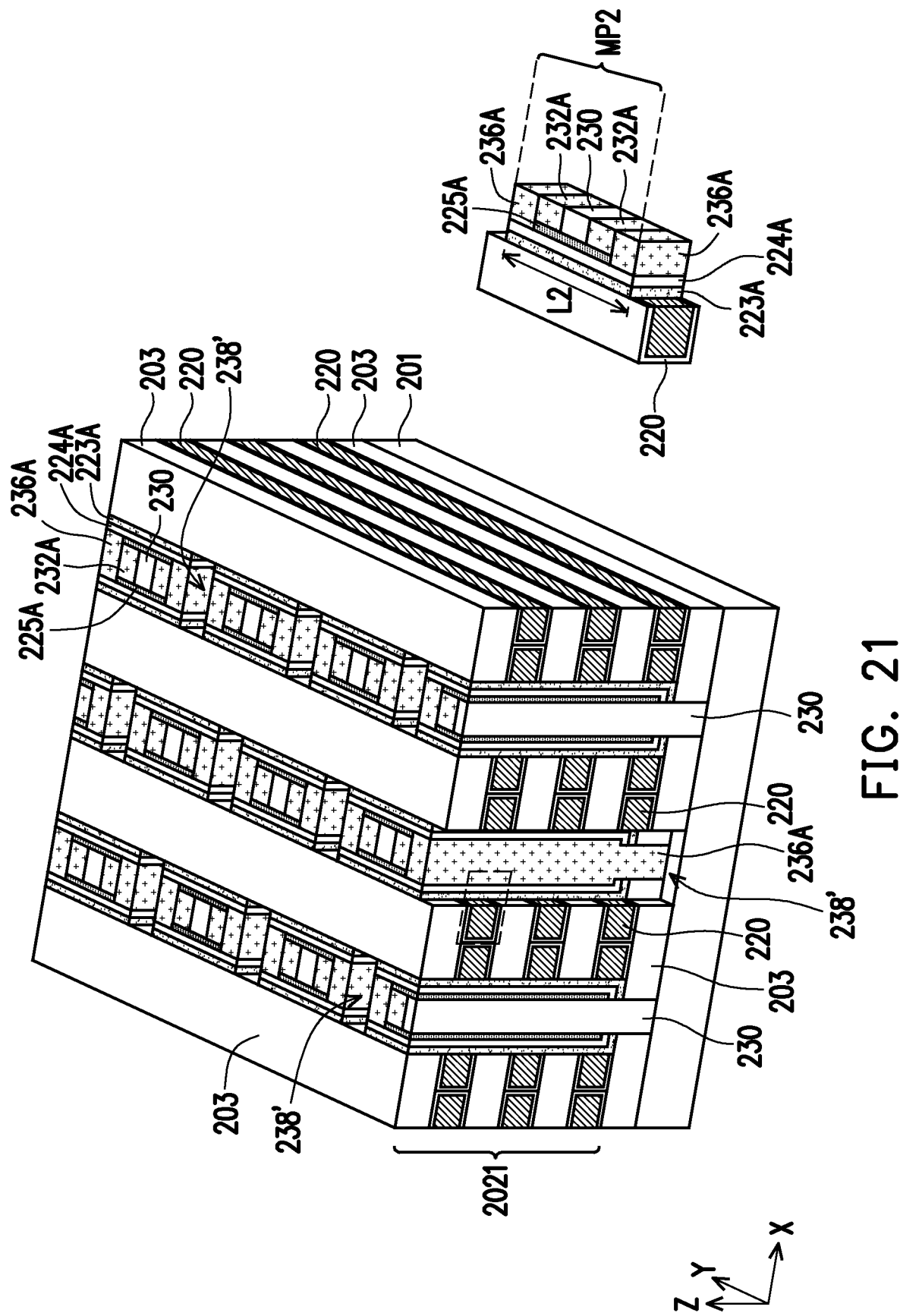

Referring to FIG. 21, using the mask patterns MP2 as the etching masks, the exposed channel material layer 224 and the adjacent ferroelectric layers 223 are removed by a selective etching process. In some embodiments, the selective etching process selectively removes the exposed channel material layer 224 and then the exposed ferroelectric layers 223 and does not remove or damage the adjacent metallic features 220 and the first dielectric layers 203. In some embodiments, the remained channel material layers 224A and the remained ferroelectric layers 223A do not extend beyond the mask patterns MP2 along the extending direction (Y-direction). That is, the extending length of the channel material layer(s) 224A or the ferroelectric layer(s) 223A is substantially the same as the total lengths of the mask pattern MP2 along the trench extending direction (Y-direction). In some embodiments, by selectively removing the exposed channel material layer 224 and the adjacent ferroelectric layers 223, the trench openings 238 are enlarged to become the trench openings 238', sidewalls of the metallic features 220 and the first dielectric layers 203 are exposed from the openings 238', and the trench openings 238' are located between the opposing metallic features 220.

From the enlarged partial 3D view of a portion (enclosed by the dotted line to represent a cell unit) of the structure as shown at the right side of FIG. 21, it is seen that the remained channel material layers 224A and the remained ferroelectric layers 223A do not extend beyond the mask patterns MP2 along the extending direction (Y-direction). In some embodiments, the channel material layer(s) 224A and the ferroelectric layer(s) 223A have substantially the same extending length L2 along the trench extending direction (Y-direction). In some embodiments, the extending length L2 is larger than the extending length L1. In some embodiments, the length L2 ranges from about 5 nm to about 5,000 nm.

Figure 22:
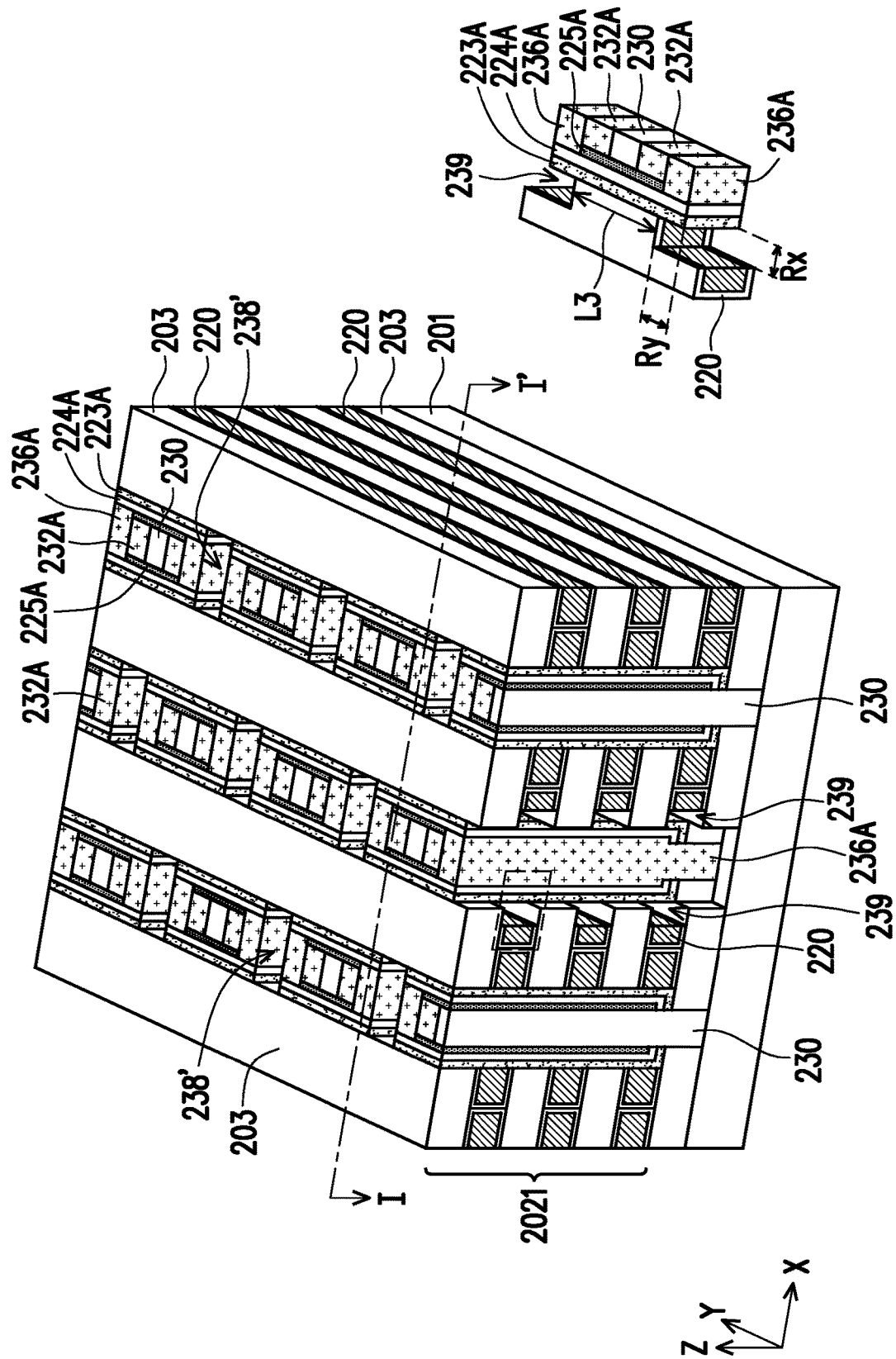

Referring to FIG. 22, using the mask patterns MP2 together with the remained channel material layers 224A and the remained ferroelectric layers 223A as the etching masks, the exposed metallic features 220 are partially removed by a selective etching process. In some embodiments, the selective etching process selectively removes the exposed metallic features 220 to form sidewall recesses 239 and does not remove or damage the adjacent first dielectric layers 203 and the adjacent channel material layers 224A and ferroelectric layers 223A.

From the enlarged partial 3D view of a portion (enclosed by the dotted line to represent a cell unit) of the structure as shown at the right side of FIG. 22, it is seen that the sidewall recesses 239 are formed like undercuts, recessing from the remained ferroelectric layers 223A in the X-direction with a distance Rx and in the Y-direction with a distance Ry. In some embodiments, the sidewall recesses 239 are separate from each other and do not merge with one another, and the remained metallic feature(s) 220 between the two adjacent sidewall recesses 239 has an extending length L3 along the extending direction (Y-direction). In FIG. 22, the remained metallic features 220 are in direct contact with the ferroelectric layers 223A. In some embodiments, the extending length L2 of the ferroelectric layer 223A/channel material layer 224A is larger than the extending length L3, and the extending length L3 is larger than the extending length L0 of the dielectric block 230. In some embodiments, the ratio of the extending length L3/L2 is about 0.2-0.8, and the ratio of the extending length L3/L0 is about 0.2-1.2. In some embodiments, the formation of the sidewall recesses 239 are limited by the upper and lower first dielectric layers 203, and the selective etching process may involve a time-controlled etching process to form cavities or recesses in the metallic features with suitable dimensions. The sidewall recesses 239 are located between the ferroelectric layers 223A and the recessed metallic features 220 and between the upper and lower first dielectric layers 203.

Figure 23:
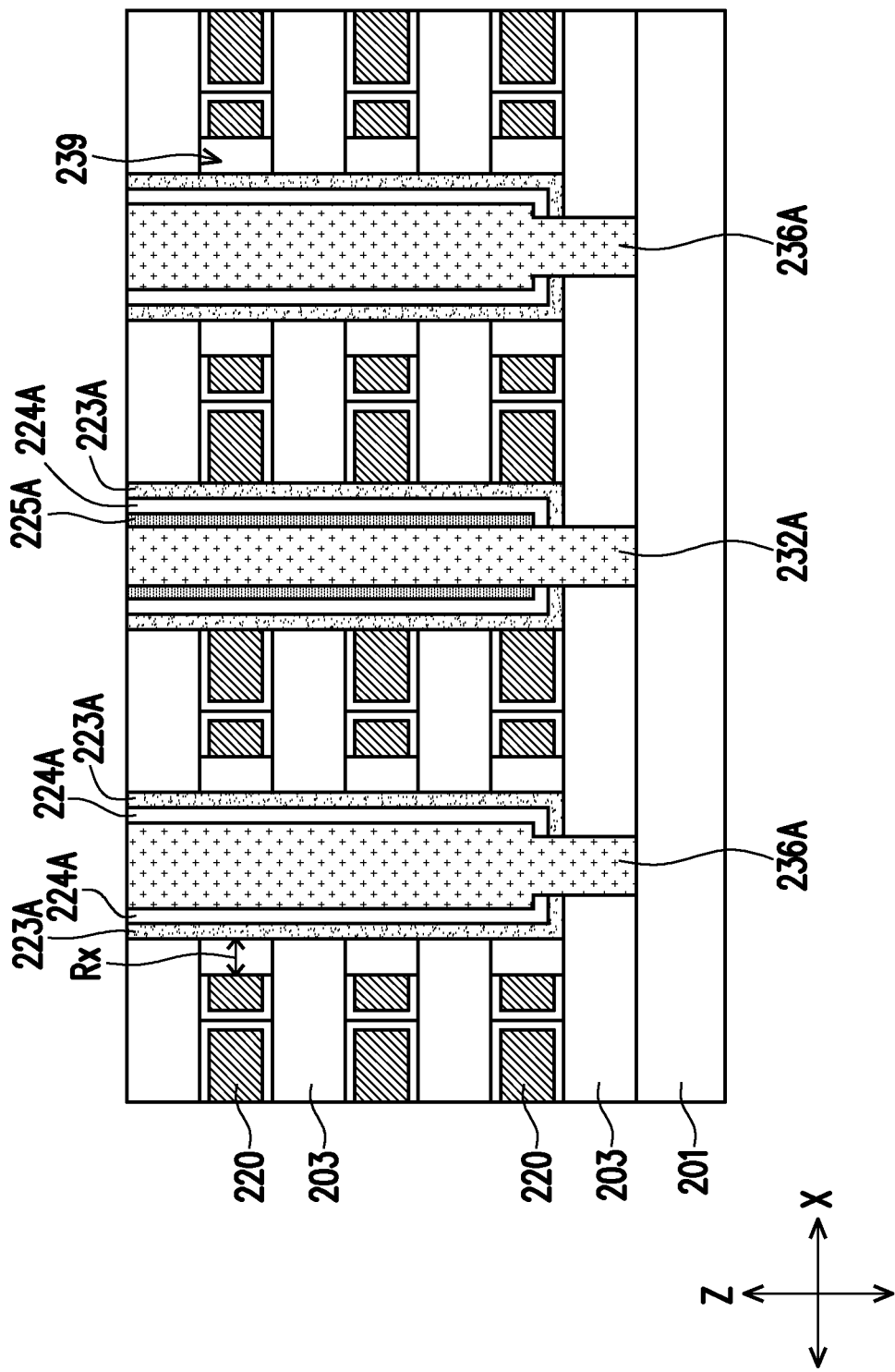

FIG. 23 is a schematic cross-sectional view showing the structure of FIG. 22 along the X-direction crossline I-I'. Referring to FIG. 23, in some embodiments, the sidewall recesses 239 beside the ferroelectric layers 223A are recessed from the sidewalls of the ferroelectric layers 223A with a distance Rx. As seen in the cross-sectional view of FIG. 23, separate sidewall recesses 239 are located next to two separate ferroelectric layers 223A located on opposing sidewalls of the same trench.

Figure 24:
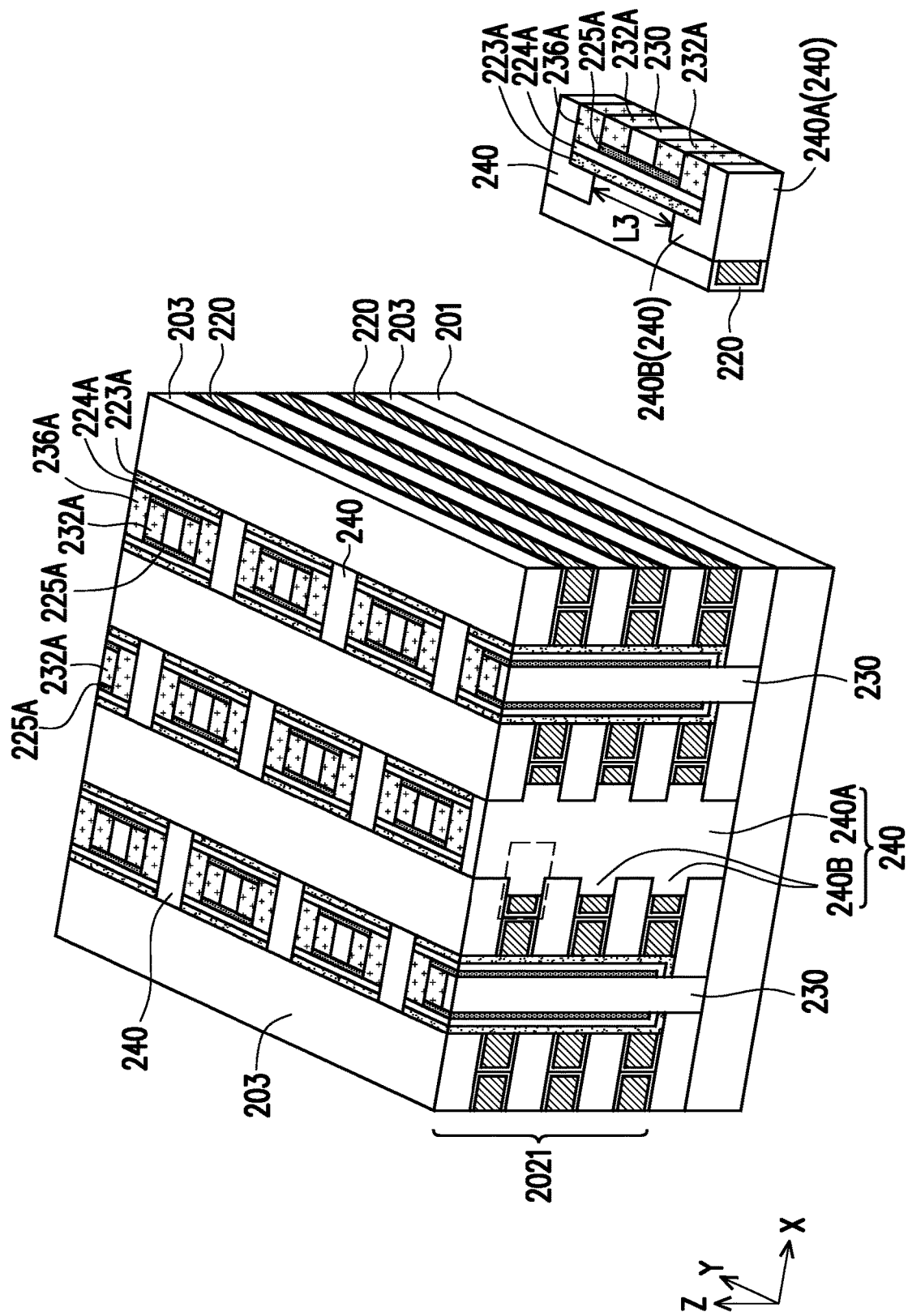

Referring to FIG. 24, dielectric layers 240 are formed to fill up the trench openings 238' and the sidewall recesses 239, so that the dielectric layers 240 are in direct contact with the remained metallic features 220 as well as in direct contact with the ferroelectric layers 223A, channel material layers 224A and insulation blocks 236A. For example, the formation of the dielectric layers 240 involves forming a dielectric material over the stacks 2021 and filling up the enlarged trench openings 238' and the sidewall recesses 239 and performing a planarization process to remove the extra dielectric material outside the trench openings 238'. In some embodiments, the material for forming the dielectric layers 240 includes silicon oxide, or one or more low-k dielectric materials or extra low-k (ELK) dielectric materials. In one embodiment, the low-k dielectric material has a dielectric constant of about less than 3.9. Examples of low-k or ELK dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HSQ), fluorinated silicon oxide (SiOF), amorphous fluorinated carbon, parylene, BCB (bis-benzocyclobutenes), or a combination thereof. In one embodiment, the material of the dielectric layers 240 includes silicon oxide or SiOF. In some embodiments, the dielectric layers 240 are formed by any compatible formation method, such as coating, CVD, PVD, ALD or the like. In FIG. 24, the dielectric layers 240 extend vertically through the stacks 2021 and the bottommost first dielectric layer 203 to reach the dielectric structure 201. In some embodiments, the dielectric layers 240 function as isolators for cell units.

From the enlarged partial 3D view of a portion (enclosed by the dotted line to represent a cell unit) of the structure as shown at the right side of FIG. 24, it is seen that the dielectric layers 240 isolate and defines the cell units. As seen in FIG. 24, portions of the dielectric layers 240 filled in the sidewall recesses 239 are referred as the extended portions 240B. The extended portions 240B are located between the ferroelectric layers 223A and the recessed metallic features 220 and between the upper and lower first dielectric layers 203. For example, the extended portions 240B of the dielectric layer 240 physically separate and space apart the ferroelectric layers 223A and the remaining metallic features 220 with the portions 240B located in-between. In some embodiments, other portions 240A of the dielectric layer 240 physically separate the adjacent insulation blocks 236A, and physically separate the ferroelectric layers 223A in adjacent cell units and physically separate the channel material layers 224A in adjacent cell units. In some embodiments, the dielectric layers 240 are in direct contact with the recessed metallic features 220 and the first dielectric layers 203 exposed from the trench openings 238'. In some embodiments, the dielectric layers 240 are located between the insulation blocks 236A and located between the opposing metallic features 220.

Figure 25:
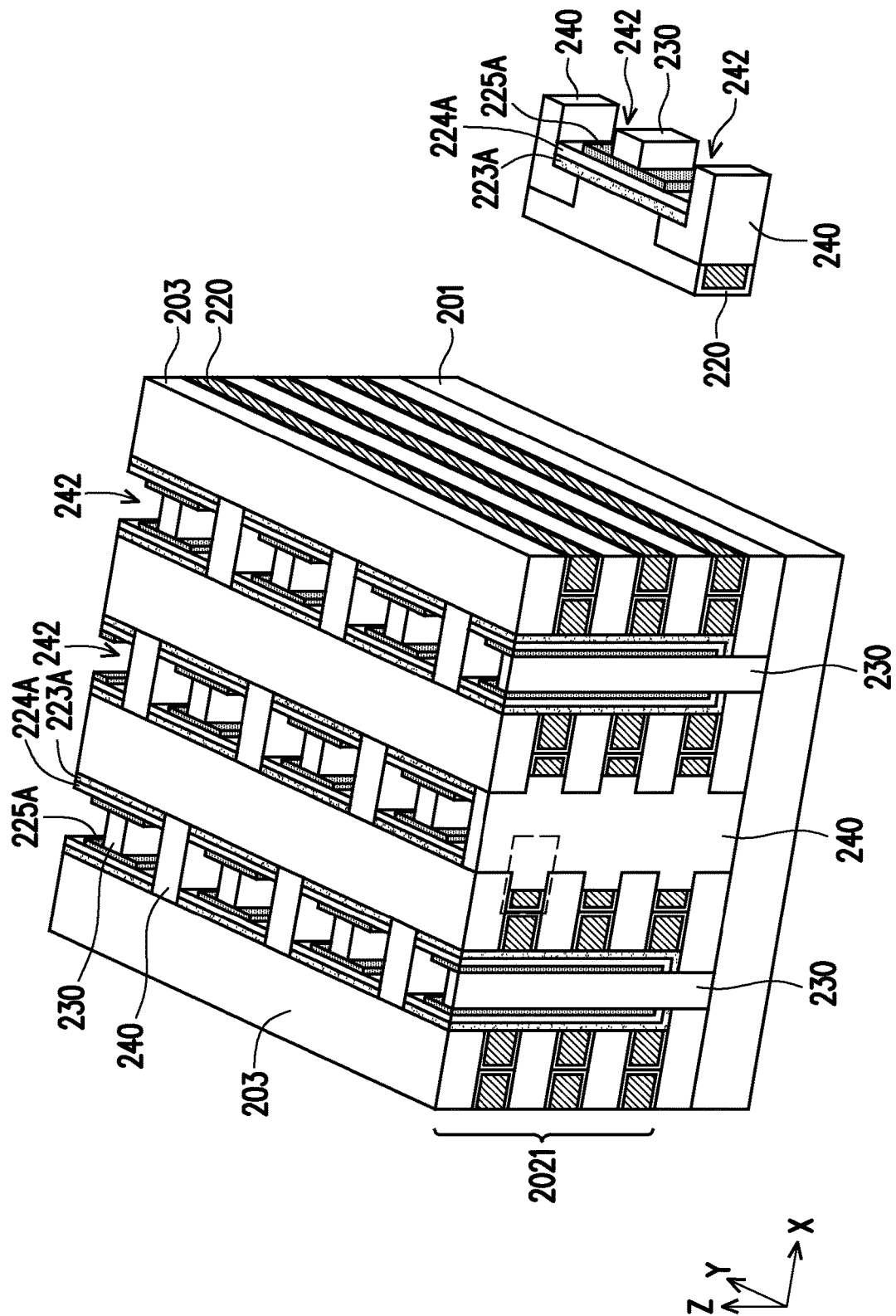

Referring to FIG. 25, an etching process is performed to remove the insulation blocks 236A and 232A to form trench openings 242. In some embodiments, the openings 242 are formed at locations where bits lines and source lines are to be formed, e.g., using suitable photolithography and etching techniques. In FIG. 25, the gate dielectric layers 225A, the channel material layers 224A and the dielectric blocks 230 are exposed by the trench openings 242. In some embodiments, the etching process is selective and does not remove the gate dielectric layers 225A, the channel material layers 224A and the dielectric blocks 230. In some embodiments, the trench openings 242 vertically extend through the stacks 2021 and the bottommost first dielectric layer 203 to expose the dielectric structure 201. The performed etching process may selectively remove the materials of the insulation blocks 236A and 232A and stop at the dielectric structure 201. In some embodiments, the openings 242 do not extend through the dielectric structure 201, in which case the later-formed bit lines and source lines may be connected to electrically conductive features overlying the memory device (e.g., metallic vias 124 and metallic lines 125 over memory devices 120/130 as seen in FIG. 1), and electrical connection to underlying FEOL circuits or devices may be achieved. It is comprehended that the openings 242 may further extend through the dielectric structure 201, which may allow the subsequently formed bit lines and source lines to directly connect to underlying FEOL circuits or device.

From the enlarged partial 3D view of a portion (enclosed by the dotted line to represent a cell unit) of the structure as shown at the right side of FIG. 25, it is seen that the ferroelectric layer 223A, the channel material layer 224A, the gate dielectric layer 225A and the dielectric block 230 are located between two dielectric layers 240 and the openings 242 are defined. In some embodiments, each trench opening 242 has a depth about the same as the depth D2 of the trench openings 228.

Figure 26:
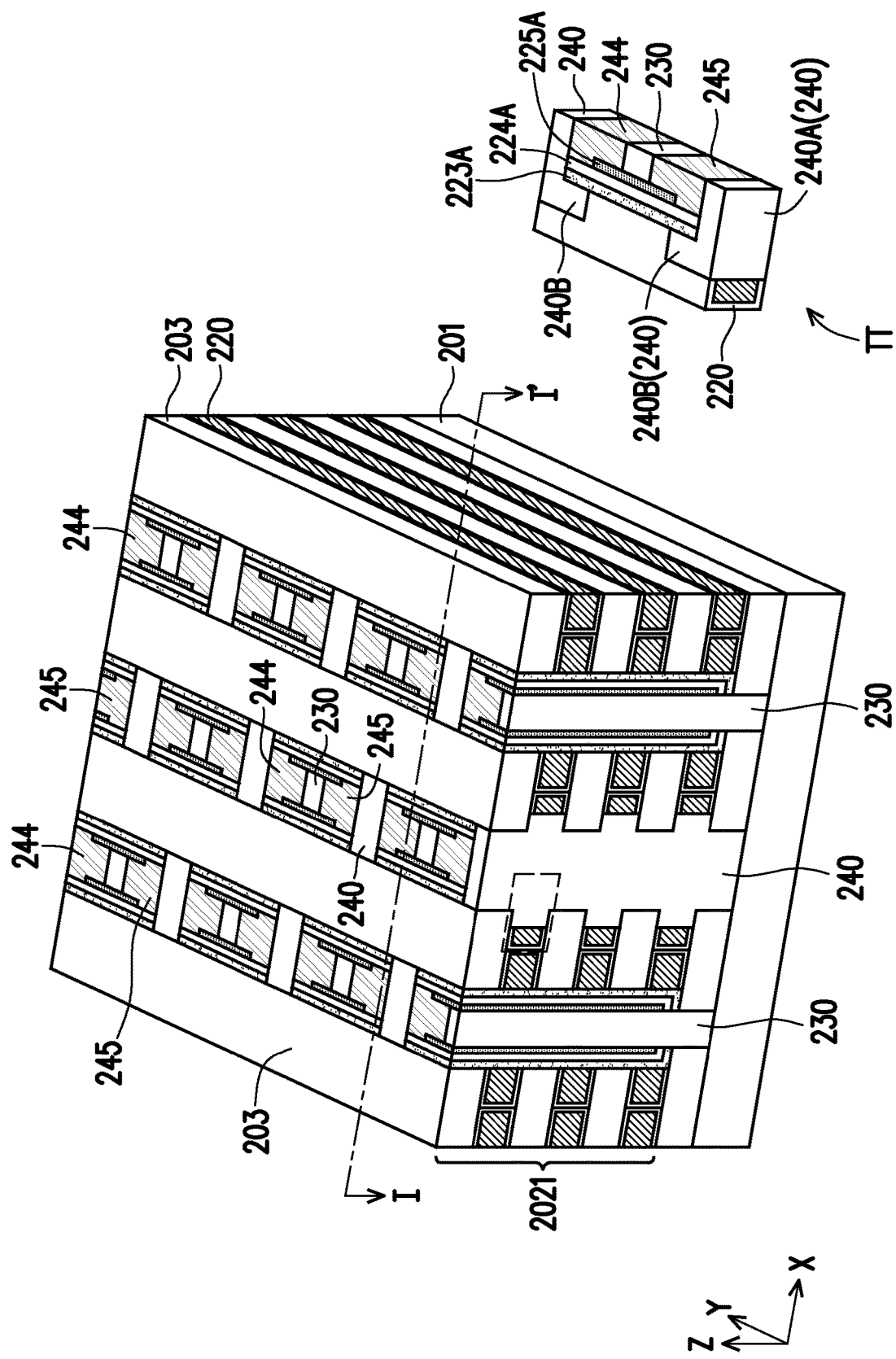

Referring to FIG. 26, electrically conductive features 244 and 245 are formed filling up the trench openings 242. In some embodiments, the electrically conductive features 244 and 245 respectively functioning as the source and drain terminals. In some embodiments, the electrically conductive features 244 are source lines and the electrically conductive features 245 are bit lines. In some other embodiments, the electrically conductive features 244 are bit lines and the electrically conductive features 245 are source lines. In some embodiments, the bit lines and the source lines may be metallic pillars filled in the trench openings 242.

From the enlarged partial 3D view of a portion (enclosed by the dotted line to represent a cell unit) of the structure as shown at the right side of FIG. 26, each memory cell TT comprises a transistor with a ferroelectric layer/film. For each transistor of the memory cell, the metallic feature(s) 220 (the word line) functions as the gate electrode of the transistor, and the electrically conductive features 244, 245 (bit line and the source line) function as the source/drain regions of the transistor, and the channel material layer 224A functions as the channel layer of the transistor. For each transistor, the dielectric block 230 disposed between the source/bit lines 244 and 245 functions as an isolation region. In some embodiments, the ferroelectric layer 223A and the channel material layer 224A are sandwiched between and isolated by the two dielectric layers 240, and the ferroelectric layer 223A works as the memory layer of the memory cell TT. That is, the ferroelectric layer 223A is used to store the digital information (e.g., a bit "1" or "0") stored in the memory cell TT. From the top view of FIG. 26, the memory cells of the 3D memory device in different trenches are staggered, such that the memory cells in neighboring trenches are disposed along different rows, or the memory cells in alternating trenches are laterally aligned along the X-direction.

In some embodiments, the extended portions 240B are located between the ferroelectric layers 223A and the recessed metallic features 220 and between the upper and lower first dielectric layers 203. That is, the recessed portions of the metallic features 220 are spaced apart from the ferroelectric layers 223A and/or the electrically conductive features 244, 245 (bit line and the source line) because the extended portions 240B are inserted there-between, leading to less coupling and lower parasitic capacitance between the word lines and the source/bit lines.

Figure 27:
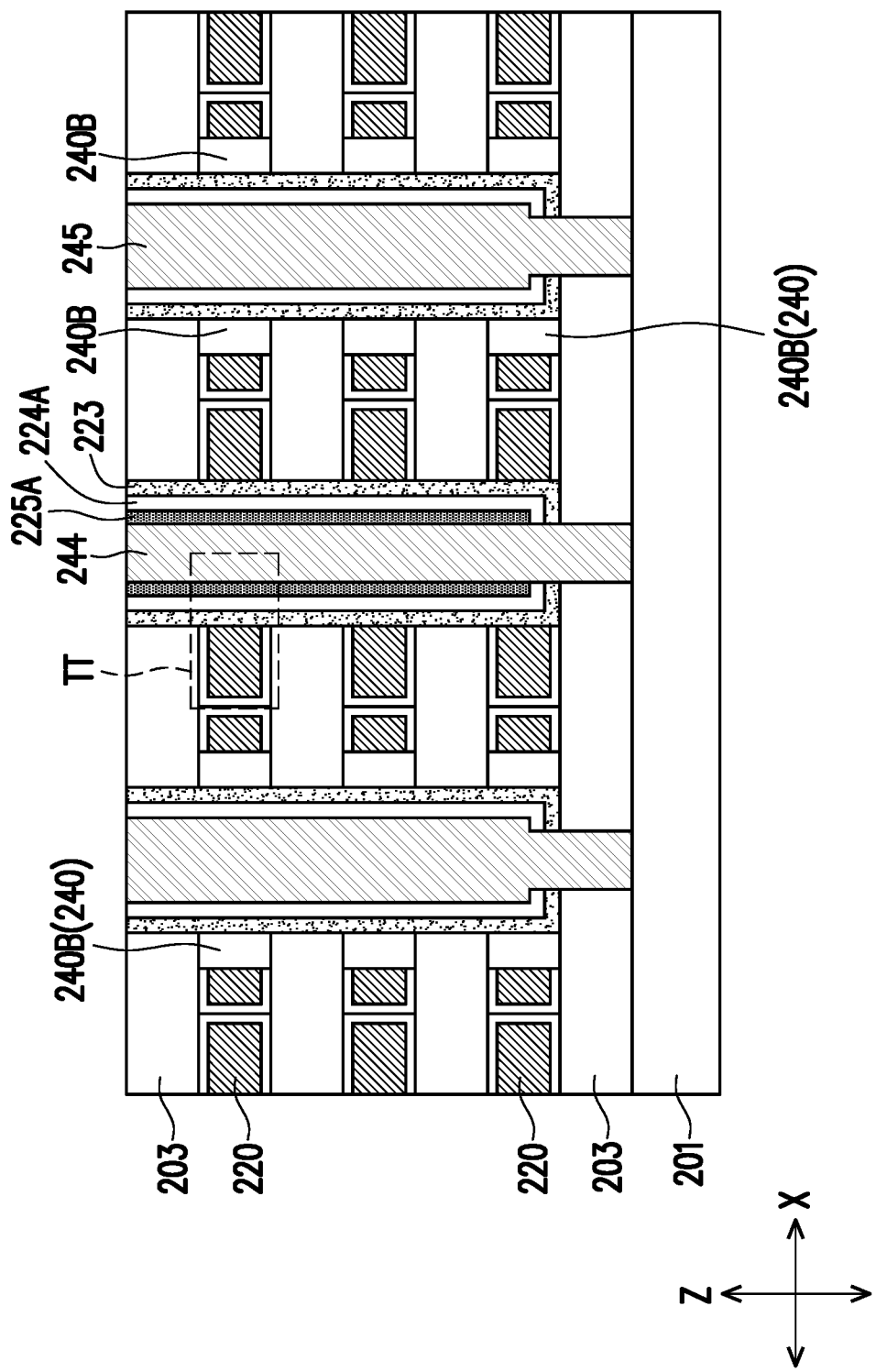
Figure 28:
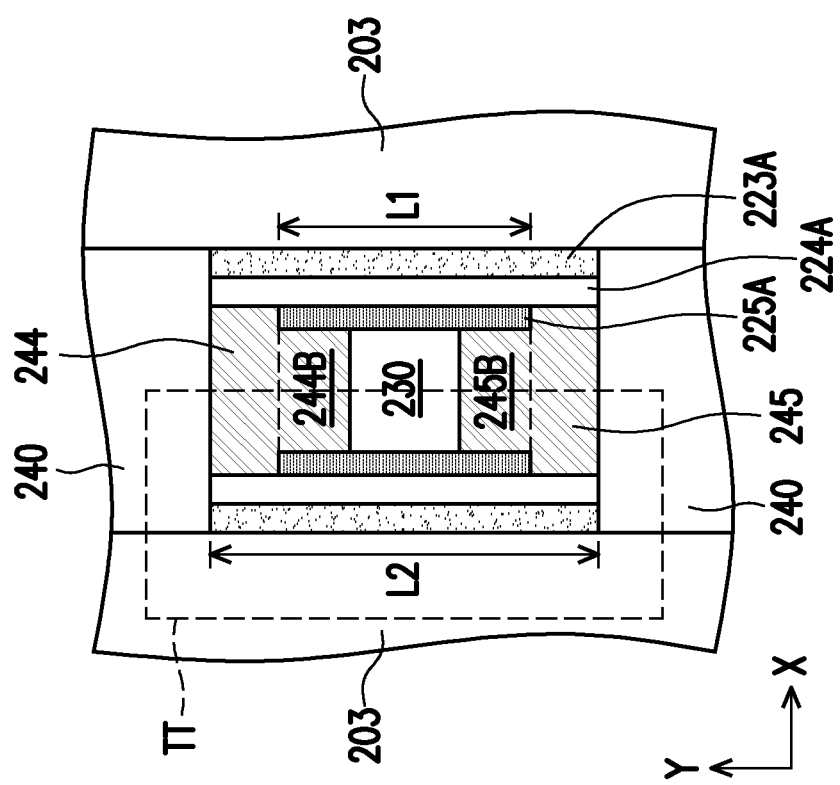

FIG. 27 is a schematic cross-sectional view showing the structure of FIG. 26 along the X-direction crossline I-I'. In the cross-sectional view of FIG. 27, the electrically conductive features 244 and 245 are connected with the gate dielectric layers 225A, and the channel material layers 224A and the electrically conductive features 244 extend through the stacks and reach the dielectric structure 201. In FIG. 27, the electrically conductive features 244 and 245 extend along and though the channel material layers 224A, and extend along and through the gate dielectric layers 225A. In one embodiment, the electrically conductive features 244 and 245 also extend through the ferroelectric layer to the dielectric structure 201.

FIG. 28 is a schematic top view showing cell units of the structure of FIG. 26 at a topmost level of the first dielectric layer 203. FIG. 29 is a schematic top view showing cell units of the structure of FIG. 26 at a lower level of the metallic features 220. As shown in FIG. 28 and FIG. 29, each of the electrically conductive features 244 and 245 (e.g. source lines/bit lines 244/245) has a T-shaped cross-section in the top planar view. Due to the relative configurations of the gate dielectric layer 225A and the channel material layer 224A, the electrically conductive features 244 and 245 respectively have confined regions 244B and 245B that are defined between the gate dielectric layers 225A and the dielectric block 230 and extend along the opposing sidewalls of the gate dielectric layers 225A and the sidewalls of the dielectric block 230. In some embodiments, the configurations of the gate dielectric layers 225A allow the other regions of the electrically conductive features 244 and 245 to contact the channel material layers 224A, but keeps the confined regions 244B and 245B separated from directly contacting the channel material layers 224A that work as channel regions. As such, the confined regions 244B and 245B act as back gates without shorting the channel regions. In the embodiments, the memory layers 223A and the channel material layers 224A of the transistors are disposed between the back gates and the word lines for the transistors. During a write operation (e.g., an erase or programming operation) for a transistor, the back gates can help reduce the surface potential of the channel layers, which further improves the performance of the memory array.

Referring to FIG. 28, in some embodiments, the isolation region 230 has a length L0 in the Y-direction ranging from about 1 nm to about 100 nm, the gate dielectric layer 225A has a length L1 in the Y-direction ranging from about 3 nm to about 2500 nm, and the channel material layer 224A and the ferroelectric layer 223A have a length L2 ranging from about 5 nm to about 5,000 nm.

Referring to FIG. 27 and FIG. 29, in some embodiments, the dielectric layers 240 filled in the sidewall recesses 239 are referred to as the extended portions 240B located between the ferroelectric layers 223A and the recessed metallic features 220. As the dielectric layers 240 having a lower dielectric constant (i.e., at least lower than a dielectric contestant of the ferroelectric material), and the extended portions 240B are inserted between the ferroelectric layers 223A and the recessed metallic features 220 (functioning as word lines), the capacitance of source/bit lines to word lines is reduced and the leakage current between the source/bit lines and the word lines is decreased. Hence, the performance of the memory device is improved, especially the RC delay performance is improved at least several times.

In some embodiments, the formation of the electrically conductive features 244 involves forming an electrically conductive material (not shown) over the stacks and filling up the openings 242, and then the extra outside the openings may be removed by performing a planarization process (such as CMP), an etching-back process, or other suitable processes. In some embodiments, the conductive materials of the electrically conductive features 244 include one or more materials selected from tungsten (W), cobalt (Co), ruthenium (Ru), molybdenum (Mo), tantalum (Ta), titanium (Ti), copper, alloys thereof, and nitrides thereof, for example. In some embodiments, the formation of the conductive metallic material may include forming seed/barrier materials and performing a plating process (such as electrochemical plating (ECP)) or CVD processes. In some embodiments, the barrier material includes titanium nitride (TiN) formed by the metal organic CVD (MOCVD) process, the seed material includes tungsten formed by CVD, and the metallic material includes tungsten formed by the CVD process (especially tungsten CVD processes).

Figure 30:
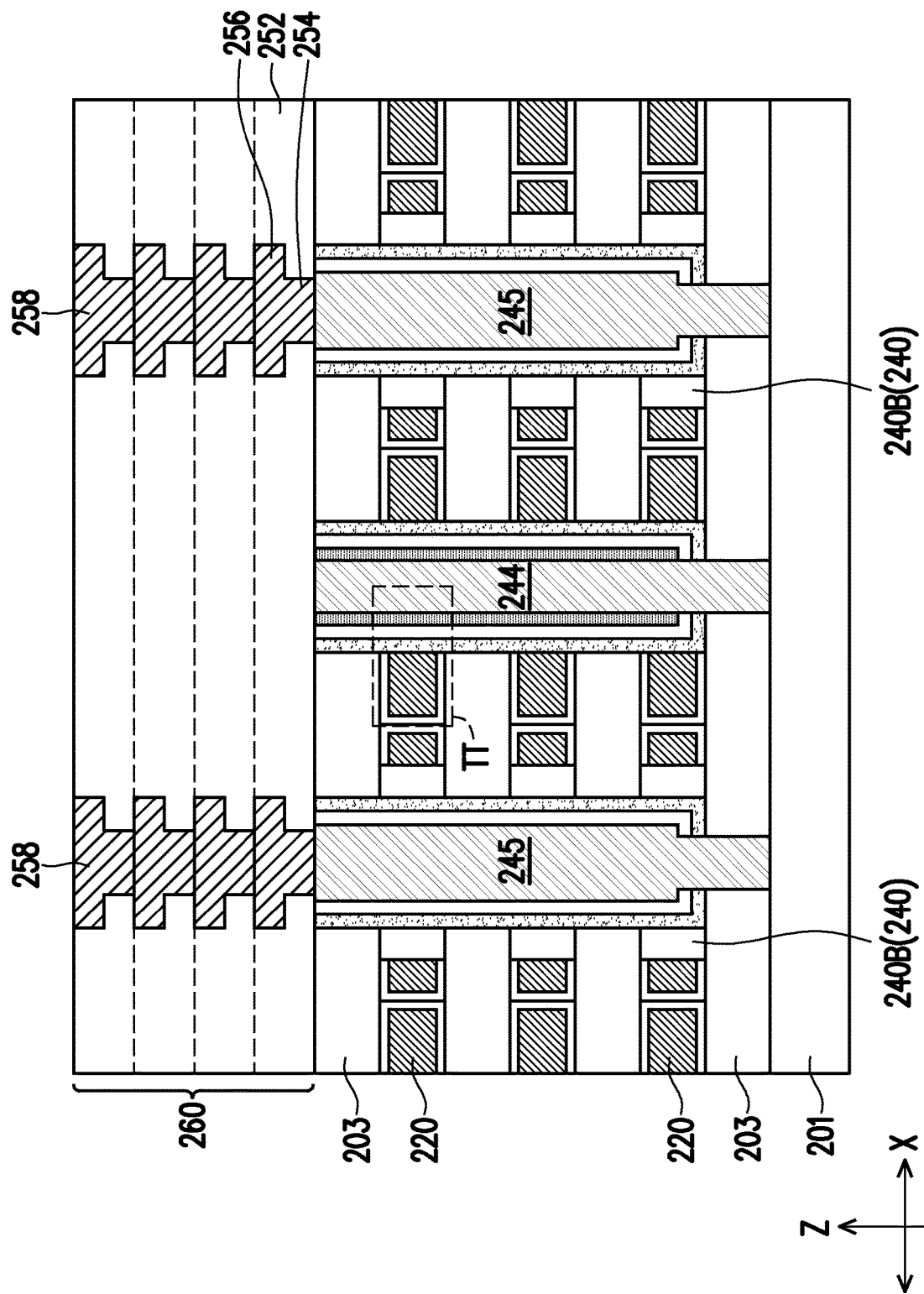

Referring to FIG. 30, in some embodiments, an interconnect structure 260 is formed over the stack structure. In some embodiments, the formation of the interconnect structure 260 may include, e.g., forming several layers of dielectric material 252 and forming metallization patterns 258 in the dielectric material 252. The material of the dielectric material 252 may include one or more low-k dielectric materials. The metallization patterns 258 may be metal interconnects including metal vias 254 and metal lines 256 formed in the dielectric material 252. In some embodiments, the interconnect structure 260 are electrically connected to the conductive features 244 and 245 (only connected to features 245 in FIG. 27), and interconnect the transistors of the memory cells TT to form functional memory arrays. Although not described herein, it is possible to form staircase structures by patterning the metallic features 220 and the dielectric layers 203 at any suitable step before the formation of the interconnect structure 260, and the interconnect structure 260 may include metal contacts connected to the exposed portions of the metallic features 220 (i.e. word lines).

Figure 31:
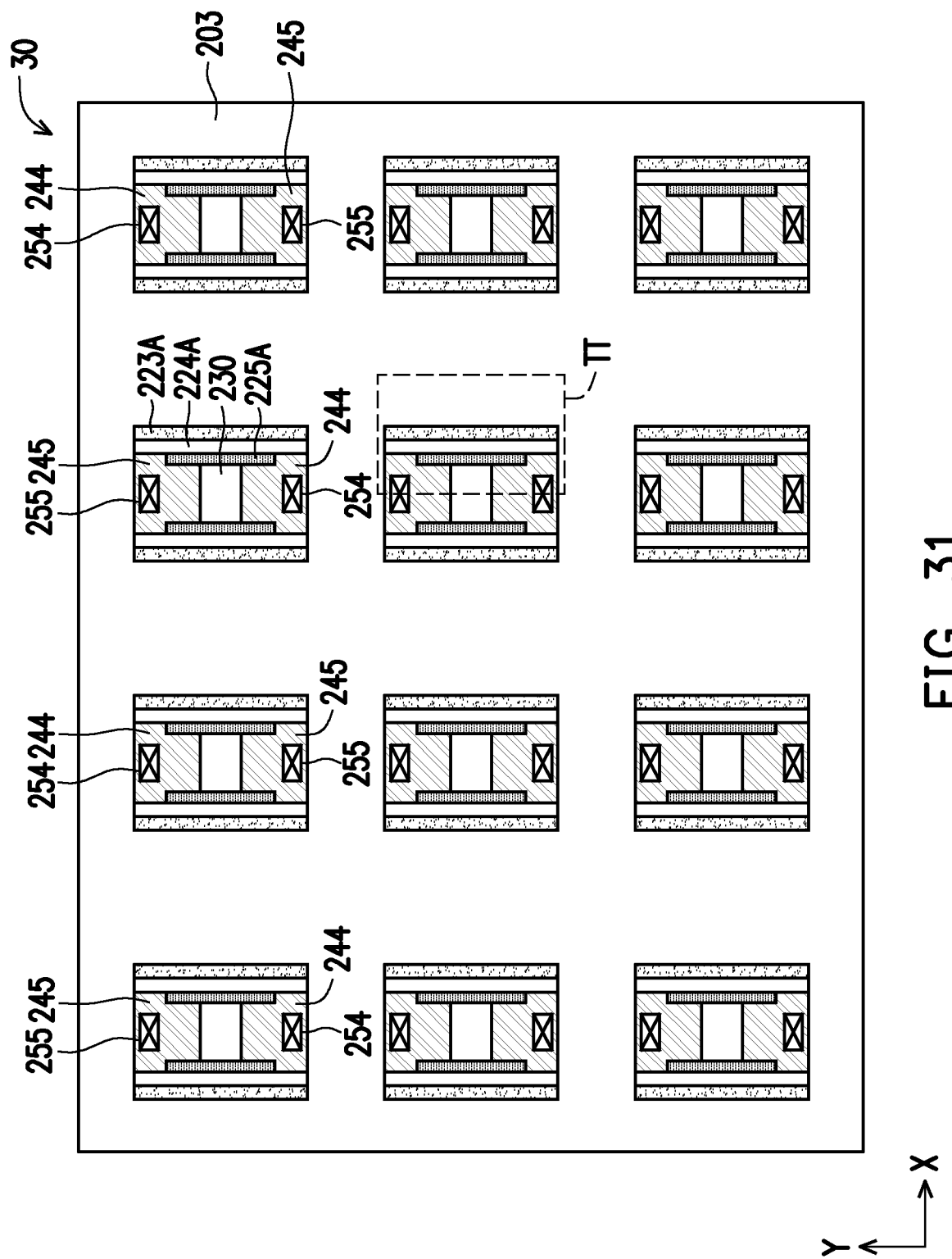
FIG. 31 and FIG. 32 are schematic top view showing an exemplary structure of a memory array according to some embodiments of the present disclosure.
Figure 32:
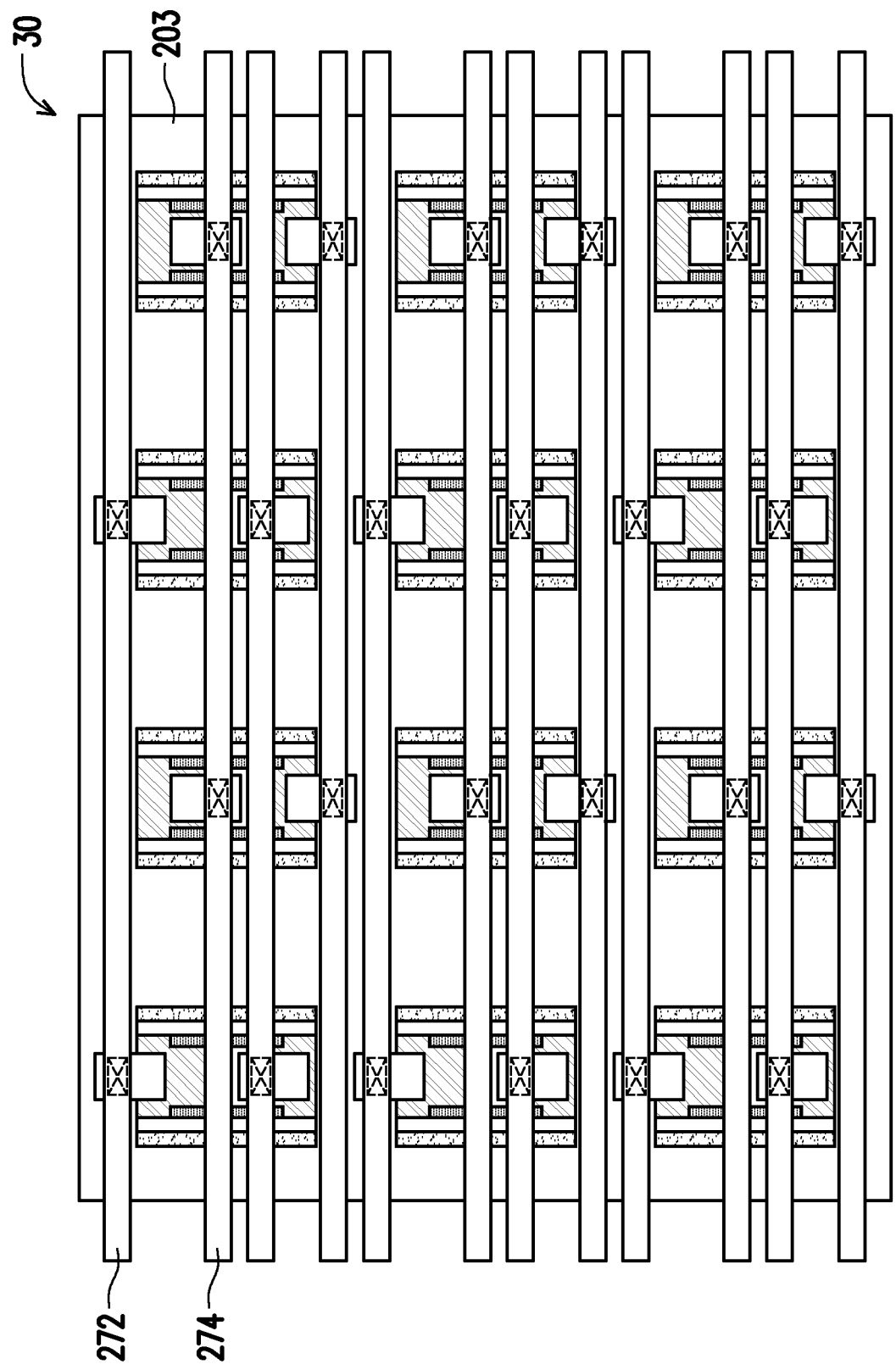

FIG. 31 and FIG. 32 are schematic top view showing an exemplary structure of memory cells of a memory array 30 according to some embodiments of the present disclosure. Some features of the memory cells of the memory array are similar or substantially the same as the features as illustrated in the previous figures and embodiments may be labelled with the same reference numbers. In FIG. 31, metal vias 254 and 255 as part of an interconnect structure are disposed over and connected to the electrically conductive features 244 and 245. Referring to the top view of FIG. 31, the memory cells in neighboring columns are disposed along the same rows or laterally aligned along the X-direction. The electrically conductive features 244 and 245 (functioning as source lines and bit lines) are arranged in an alternating pattern along rows and columns of the memory array 30. In this embodiment, adjacent bit lines and adjacent source lines are laterally aligned with one another along the X-direction. Later, more metal lines and metal vias may be formed over the metal vias 254 and 255.

Referring to FIG. 32, the metal lines 272 and 274 are formed over and connected to the metal vias 254 and 255 as bit line interconnects and source line interconnects.

FIG. 33 to FIG. 36 are schematic top views of structures produced at various stages of a manufacturing method of a memory device according to some embodiments of the present disclosure.

Figure 33:
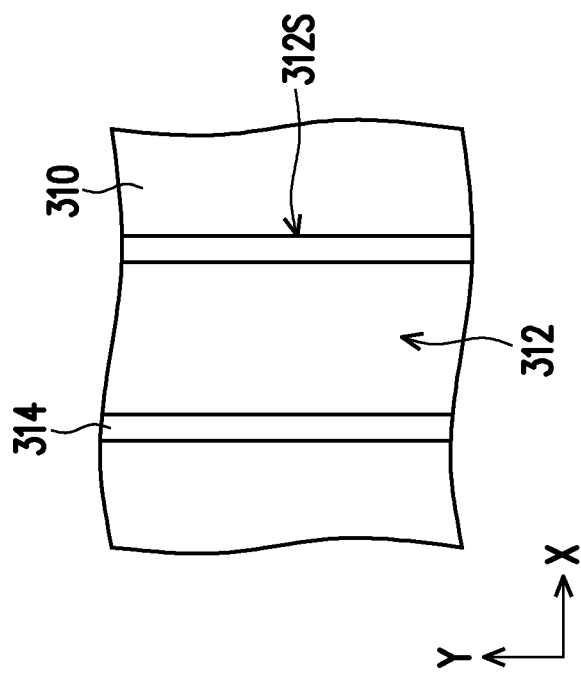

Referring to FIG. 33, a multilayered stack structure 310 is provided with a trench 312. The stack structure 310 and the trench 312 are similar to the multilayered stack 2021 and the major trench as described in FIG. 12 in the previous embodiments. That means the stack 310 includes multiple layers of the dielectric layers and multiple layers of the metallic features (word-lines) alternately sandwiched between the dielectric layers. It is understood that only one trench is shown as an exemplary portion of the structure, but the number and the configuration of the trench is not limited by the figures provided herein. In some embodiments, a liner layer 314 is formed on and over the inner surfaces 312S of the trench 312. The formation of the liner layer 314 involves forming a lining material over the entire trench 312 in the stack structure 310 conformally covering the sidewall surfaces and the bottom surface of the trench 312. In some embodiments, the material of the liner layer 314 includes silicon oxide, or one or more low-k dielectric materials or ELK dielectric materials. Examples of low-k or ELK dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HSQ), fluorinated silicon oxide (SiOF), amorphous fluorinated carbon, parylene, BCB (bis-benzocyclobutenes), or a combination thereof. In one embodiment, the material of the dielectric layers 240 includes silicon oxide or SiOF. In some embodiments, the liner layer 314 is formed by any compatible formation method, such as coating, CVD, PVD, ALD or the like.

Figure 34:
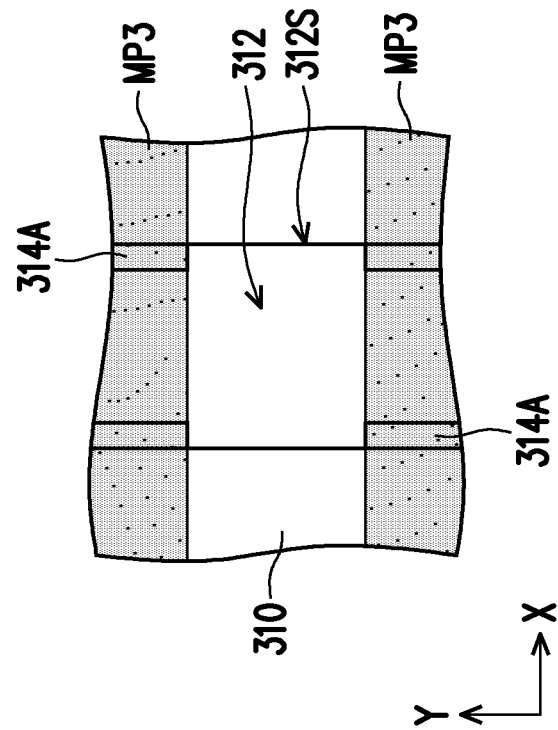

Referring to FIG. 34, a mask pattern MP3 is formed over the stack structure 310. Later, using the mask pattern MP3 as the mask, the liner layer 314 is partially removed so that the exposed portions of the liner layer 314 that are uncovered by the mask pattern MP3 are removed to form liner patterns 314A. It is comprehended that the liner patterns 314A covers portions of the inner surfaces 312S of the trench 312 (including sidewall surfaces and the bottom surface of the trench 312). In some embodiments, the liner patterns 314A may be strip-shaped patterns covering sidewall surfaces and the bottom surface of the trench 312.

Referring to FIG. 35, in some embodiments, a ferroelectric layer 316 and a channel material layer 318 are sequentially formed on the liner pattern 314A and over the trench 312, but the ferroelectric layer 316 and the channel material layer 318 do not fill the trench 312. In some embodiments, the formation process involves forming a ferroelectric material (not shown) conformally to line the sidewalls and bottoms of the trench 312 and forming a channel material (not shown) conformally over the ferroelectric material, and later inner trenches IT3 are formed by patterning. The materials and methods for forming the ferroelectric material and the channel material are similar to the materials and methods described in the previous embodiments, and the details are not repeated herein. Afterwards, a planarization process (such as CMP) or an etching process, may be performed to remove excess portions of the ferroelectric material and the channel material from the top surfaces of the multilayered stack 310.

Referring to FIG. 36, a dielectric layer 320 is formed to fill up the inner trench IT3. Similarly, as described in the previous embodiments, the formed inner trench IT3 and the later filled dielectric layers 320 physically split up the sequentially formed ferroelectric material and channel material into two parts (i.e. left and right parts located respectively on left and right sidewalls of the trench 312). Afterwards, a planarization process (such as CMP) or an etching process, may be performed to remove excess portions of the dielectric material from the multilayered stack 310. Later, the source and drain regions 322 and 324 and the back gate 328 and the surrounding gate dielectric layer 326 are formed. In some embodiments, the formation of the source and drain regions 322 and 324 involves performing a vertical anisotropic etching process using a mask pattern to form openings, and followed by forming a metallic material (not shown) filling the openings. In some embodiments, the formation of the gate dielectric layer 326 and the back gate 328 involves removing the dielectric layer 320 between the source and drain regions 322 and 324 to form a trench opening, depositing the gate dielectric layer 326 around the sidewalls of the trench opening without filling the trench opening and forming a metallic material (not shown) inside the trench opening and surrounding by the gate dielectric layer 326 and filling the trench opening. Suitable metallic materials include tungsten, TiN, TaN or combinations thereof. In some embodiments, the material of the gate dielectric layer 326 is different from the material of the dielectric layer 320. In other embodiments, the materials of the gate dielectric layer 326 and the dielectric layer 320 may be the same, and a portion of the dielectric layer 320 located between the source and drain regions 322 and 324 may be remained on the channel material layer 318 before the formation of the back gate 328. The materials and methods for forming the source and drain regions 322, 324, the back gate 328 and the gate dielectric layer 326 may be similar to the materials and methods described in the previous embodiments, and the details are not repeated herein. The source and drain regions 322 and 324 are source lines and bit lines extending vertically through the multilayered stack structure 310. Referring to FIG. 36, the channel material layer 318 extends along the sidewall of the ferroelectric layer 316 in the trench extending direction (Y-direction) and the channel material layer 318 and the ferroelectric layer 316 have substantially the same extending length. That means the channel material layer 318 and the ferroelectric layer 316 extend beyond the source and drain regions 322 and 324. In FIG. 36, in some embodiments, the back gate 328 and the surrounding gate dielectric layer 326 are located between the opposing channel material layers 318 and the source and drain regions 322 and 324. In some embodiments, the channel material layers 318 extend beyond the source and drain regions 322 and 324. In FIG. 36, the liner patterns 314A are located between the ferroelectric layers 316 and the stack structure 310. As the liner patterns 314A having a lower dielectric constant are inserted between the ferroelectric layers 316 and the stack structure 310 that includes word lines, the capacitance of source/bit lines to word lines is reduced and the leakage current between the source/bit lines and the word lines is decreased. Hence, the performance of the memory device 36 is improved.

FIG. 37 and FIG. 38 are schematic cross-sectional views showing a portion of the exemplary structure(s) of a memory device according to embodiments of the present disclosure.

In some embodiments, referring to FIG. 37, the channel material layer 318' extends along the sidewall of the ferroelectric layer 316 in the trench extending direction (Y-direction), but the channel material layer 318' does not extend beyond the source and drain regions 322 and 324. That means the channel material layer 318' has an extending length shorter than the extending length of the ferroelectric layer 316 in the Y-direction. In some embodiments, the channel material layer 318' and the source and drain regions 322 and 324 are isolated by two insulation blocks 340 in the memory device 37. In some embodiments, the back gate and the gate dielectric layer may be omitted and the remained dielectric layer 320' is sandwiched between the source and drain regions 322 and 324 and the channel material layers 318'.

In some embodiments, referring to FIG. 38, similar to the memory device 36, the gate dielectric layer 236' and the back gate 328' are formed in the memory device 38. In some embodiments, the span of the back gate 328' is enlarged with the gate dielectric layer 326' surrounding the back gate 328'. By forming openings and removing portions of the channel material layers 318, the span of the back gate 328' is enlarged and the channel thickness may be changed, thus adjusting the threshold voltage and mobility of the device.

Also, as shown in FIG. 37 and FIG. 38, the liner patterns 314A are located between the ferroelectric layers 316 and the stack structure 310. As the liner patterns 314A having a lower dielectric constant (e.g. at least lower than a dielectric constant of the ferroelectric material) are inserted between the ferroelectric layers 316 and the stack structure 310 that includes word lines, the capacitance of source/bit lines to word lines is reduced and the leakage current between the source/bit lines and the word lines is decreased. Hence, the performance of the memory device 37 or 38 is improved.

In accordance with some embodiments of the disclosure, a memory device is described. A multilayered stack is disposed over a dielectric structure, and the multilayered stack includes first conductive layers and first dielectric layers stacked in alternation. A second dielectric layer is disposed over the dielectric structure and penetrates through the first conductive layers and the first dielectric layers. A first conductive line and a second conductive line are disposed at opposite sides of the second dielectric layer. A pair of dielectric blocks respectively disposed alongside the first conductive line and the second conductive line. A memory layer is disposed between the pair of dielectric blocks and penetrates through the first conductive layers and the first dielectric layers. A channel material layer is disposed between the pair of dielectric blocks and disposed between the first and second conductive lines and the memory layer, and the channel material layer extends vertically along the memory layer. Each of the pair of dielectric blocks has an extended portion located between the memory layer and one of the first conductive layers, and a material of the pair of dielectric blocks has a dielectric constant lower than that of a material of the memory layer.

In accordance with some embodiments of the disclosure, a memory device including a word line, a source line, a bit line, a memory layer, a channel material layer is described. The word line extends in a first direction, and liner layers disposed on a sidewall of the word line. The memory layer is disposed on the sidewall of the word line between the liner layers and extends along sidewalls of the liner layers in the first direction. The liner layers are spaced apart by the memory layer, and the liner layers are sandwiched between the memory layer and the word line. The channel material layer is disposed on a sidewall of the memory layer. A dielectric layer is disposed on a sidewall of the channel material layer. The source line and the bit line are disposed at opposite sides of the dielectric layer and disposed on the sidewall of the channel material layer. The source line and the bit line extend in a second direction perpendicular to the first direction. A material of the liner layers has a dielectric constant lower than that of a material of the memory layer.

In accordance with some embodiments of the disclosure, a manufacturing method of a memory device is provided. A multilayered stack is formed by forming alternating first conductive layers and first dielectric layers. Trenches extending vertically through the multilayered stack are formed. A ferroelectric material and a channel material are formed sequentially covering exposed surfaces of the trenches. The ferroelectric material and the channel material are partially removed to form ferroelectric layers and channel material layers inside the trenches. Dielectric blocks are formed in the trenches and between the opposing ferroelectric layers in the same trench. Mask patterns with first openings are formed in the trenches. The ferroelectric layers and channel material layers are etched by using the mask patterns as etching masks. The first conductive layers are recessed using the mask patterns, the etched ferroelectric layers and the etched channel material layers as etching masks to form sidewall recesses in the first conductive layers. A second dielectric material is formed filling up the first openings and the sidewall recesses. The mask patterns are removed to form second openings. A conductive material is formed filling up the second openings to form bit lines and source lines extending vertically through the multilayered stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a word line extending in a first direction;
liner layers disposed on a sidewall of the word line;
a memory layer, disposed on the sidewall of the word line between the liner layers and extending along sidewalls of the liner layers in the first direction, wherein the liner layers are spaced apart by the memory layer and the liner layers are sandwiched between the memory layer and the word line;
a channel material layer disposed on a sidewall of the memory layer;
a dielectric layer disposed on a sidewall of the channel material layer; and
a source line and a bit line, disposed at opposite sides of the dielectric layer and disposed on the sidewall of the channel material layer, wherein the source line and the bit line extend in a second direction perpendicular to the first direction,
wherein a material of the liner layers has a dielectric constant lower than that of a material of the memory layer.

2. The memory device of claim 1, wherein the channel material layer extends along the sidewall of the memory layer in the first direction, and the channel material layer and the memory layer have a substantially the same extending length in the first direction.

3. The memory device of claim 1, wherein the channel material layer extends along sidewalls of the source line, the dielectric layer and the bit line in the first direction, and the channel material layer has an extending length shorter than an extending length of the memory layer in the first direction.

4. The memory device of claim 1, further comprising a back gate in the dielectric layer and surrounded by the dielectric layer.

5. The memory device of claim 1, wherein the memory layer comprises a ferroelectric layer.

6. The memory device of claim 5, wherein a material of the ferroelectric layer includes hafnium zirconium oxide (HfZrO), zirconium oxide (ZrO), undoped hafnium oxide (HfO) or HfO doped with lanthanum (La), silicon (Si), or aluminum (Al).

7. The memory device of claim 1, wherein a material of the liner layers includes a low-k dielectric material having a dielectric constant less than 3.9.

8. The memory device of claim 1, wherein a material of the channel material layer includes zinc oxide (ZnO), indium tungsten oxide (InWO), indium gallium zinc oxide (IGZO), indium zinc oxide (IZO), indium tin oxide (ITO) or zinc tin oxide (ZTO).

9. A memory device, comprising:
a word line extending in a first direction;
liner layers disposed on a sidewall of the word line;
a memory layer, disposed on the sidewall of the word line between the liner layers and extending along sidewalls of the liner layers in the first direction, wherein the liner layers are spaced apart by the memory layer and the liner layers are sandwiched between the memory layer and the word line;
a channel material layer disposed on a sidewall of the memory layer;
a dielectric layer disposed on a sidewall of the channel material layer; and
a source line and a bit line, disposed at opposite sides of the dielectric layer and disposed on the sidewall of the channel material layer, wherein the source line and the bit line extend in a second direction perpendicular to the first direction,
wherein the liner layers are of a same material that is different from a material of the dielectric layer and different from a material of the memory layer.

10. The memory device of claim 9, wherein the channel material layer extends along the sidewall of the memory layer in the first direction, and the channel material layer and the memory layer have a substantially the same extending length in the first direction.

11. The memory device of claim 9, wherein the channel material layer extends along sidewalls of the source line, the dielectric layer and the bit line in the first direction, and the channel material layer has an extending length shorter than an extending length of the memory layer in the first direction.

12. The memory device of claim 9, further comprising a back gate in the dielectric layer and surrounded by the dielectric layer.

13. The memory device of claim 9, wherein the memory layer comprises a ferroelectric layer.

14. The memory device of claim 13, wherein a material of the ferroelectric layer includes hafnium zirconium oxide (HfZrO), zirconium oxide (ZrO), undoped hafnium oxide (HfO) or HfO doped with lanthanum (La), silicon (Si), or aluminum (Al).

15. The memory device of claim 9, wherein the material of the liner layers includes a low-k dielectric material having a dielectric constant lower than that of the material of memory layer.

16. The memory device of claim 9, wherein a material of the channel material layer includes zinc oxide (ZnO), indium tungsten oxide (InWO), indium gallium zinc oxide (IGZO), indium zinc oxide (IZO), indium tin oxide (ITO) or zinc tin oxide (ZTO).

17. A memory device, comprising:
a word line extending in a first direction;
liner layers disposed on a sidewall of the word line and extending in parallel;
a memory layer, disposed on the sidewall of the word line between the liner layers and extending along sidewalls of the liner layers in the first direction, wherein the liner layers are sandwiched between the memory layer and the word line, and a portion of the memory layer is located between the parallel liner layers;

a channel material layer disposed on a sidewall of the memory layer;

a dielectric layer disposed on a sidewall of the channel material layer;

a source line and a bit line, disposed at opposite sides of the dielectric layer and disposed on the sidewall of the channel material layer, wherein the source line and the bit line extend in a second direction perpendicular to the first direction; and insulating dielectric layers, disposed on sidewalls of the bit line and the source line and extending in the second direction, wherein a dielectric constant of the liner layer is lower than that of the memory layer.

18. The memory device of claim 17, wherein the channel material layer extends along sidewalls of the source line, the dielectric layer and the bit line in the first direction and the channel material layer has substantially a same thickness.

19. The memory device of claim 17, further comprising a back gate in the dielectric layer and surrounded by the dielectric layer.

20. The memory device of claim 19, wherein the channel material layer extends along sidewalls of the source line, the dielectric layer and the bit line in the first direction, and a portion of the channel material layer beside the back gate has a first thickness smaller than a second thickness of the channel material layer beside the source line or the bit line.

* * * * *